United States Patent
Takahashi et al.

(12) 
(10) Patent No.: US 6,788,159 B2
(45) Date of Patent: Sep. 7, 2004

(54) TEMPERATURE COMPENSATED OSCILLATOR, ADJUSTING METHOD THEREOF, AND INTEGRATED CIRCUIT FOR TEMPERATURE COMPENSATED OSCILLATOR

(75) Inventors: Masayuki Takahashi, Nasu-gun (JP); Toru Matsumoto, Nasu-gun (JP)

(73) Assignee: Nippon Precision Circuits Inc., Tokyo (JP)

(*) Notice: Subject to any disclaimer, the term of this patent is extended or adjusted under 35 U.S.C. 154(b) by 0 days.

(21) Appl. No.: 10/252,951

(22) Filed: Sep. 23, 2002

(65) Prior Publication Data

US 2003/0067361 A1 Apr. 10, 2003

(30) Foreign Application Priority Data

Oct. 9, 2001 (JP) ........................................ 2001-311210

(51) Int. Cl.[7] ................................................ H03L 1/00
(52) U.S. Cl. .................. 331/176; 331/158; 331/116 FE; 331/179; 331/66; 331/177 V; 331/36 C
(58) Field of Search ................................. 331/176, 179, 331/158, 66, 116 FE, 36 C, 177 V

(56) References Cited

U.S. PATENT DOCUMENTS 6,172,576 B1 * 1/2001 Endo et al. ............. 331/116 R

* cited by examiner

*Primary Examiner*—Arnold Kinkead
(74) *Attorney, Agent, or Firm*—Jordan and Hamburg LLP

(57) ABSTRACT

A temperature compensated oscillator keeping the area of a capacitor array and the bit number of a memory from increasing and allowing for high precision is provided. A adjusting method of such a resonator and an integrated circuit for temperature compensated oscillation are also provided. A capacitor array and a variable capacitance diode are connected and used as a load capacitance in an oscillation circuit, and the capacitance value of the former is digital-controlled and that of the latter is analog-controlled, so that the amount of compensation data necessary for the digital control is reduced and highly precise temperature compensation is permitted.

20 Claims, 20 Drawing Sheets

VTa Temperature Characteristic

TEMPERATURE COMPENSATED OSCILLATOR, ADJUSTING METHOD THEREOF, AND INTEGRATED CIRCUIT FOR TEMPERATURE COMPENSATED OSCILLATOR

BACKGROUND OF THE INVENTION

1. Field of the Invention

The present invention relates to a temperature compensated oscillator, an adjusting method thereof, and an integrated circuit for temperature compensated oscillator. The invention more particularly relates to a temperature compensated oscillator that corrects frequency fluctuations caused by changes in ambient temperatures by digital control, an adjusting method thereof, and an integrated circuit for temperature compensated oscillator.

2. Description of the Prior Art

A conventional system having a timer function such as a clock and an RTC (Real Time Clock) normally uses a crystal oscillator with a tuning fork crystal resonator operating at 32.768 KHz or an AT cut crystal resonator operating at 4.194304 MHz.

The tuning fork crystal resonator operating at 32.768 KHz can oscillate with low current consumption but suffers from disadvantageous frequency fluctuations caused by temperature changes. Meanwhile, heat from the user's body can change the temperature of the outer part of a watch, but the surrounding part of the resonator is kept at a relatively fixed temperature, and therefore the low current consumption characteristic of the tuning fork resonator can be advantageous in this application.

Conversely, the AT cut crystal resonator operating at 4.194304 MHz suffers less from frequency fluctuations caused by temperature changes than the tuning fork type, while it requires large current for oscillation.

Conventionally, the advantages and disadvantages are balanced against each other, and either the tuning fork type or the AT cut type has been used. In recent years, however, with increasing demands for lower power consumption systems, the AT cut type resonator has been less frequently used. As a result, the disadvantage of the tuning fork type resonator in association with the temperature characteristic has been more often pointed out.

The frequency-temperature characteristic of the tuning fork type crystal resonator can generally be approximated by the following quadric:

$$\Delta f/f = A_2(T-T_0)^2 + A_0$$

where $T_0$ represents the reference temperature that as well as the coefficient of the quadric varies among crystals. FIG. 16 shows an example of a frequency-temperature characteristic.

Meanwhile, the oscillation frequency of a crystal oscillation circuit is as follows:

$$f_0 = f_s(1 + 1/(2C_0/C_1(1+C_L/C_0)))$$

where $f_s$, $C_0$, and $C_1$ represent the resonance frequency, equivalent parallel capacitance, and equivalent series capacitance of the crystal resonator, respectively. $C_L$ represents the load capacitance of the oscillation circuit. From the equation, assuming that load capacitance $C_L$ is variable with temperature T, the frequency can be adjusted, so that temperature compensation can be carried out. An example of the variable characteristic of the frequency depending upon load capacitance $C_L$ is shown in FIG. 17.

As can be understood from FIG. 16, in the temperature range from −35° C. to 85° C., a frequency deviation in the range from −20 ppm to 200 ppm at most must be compensated. Meanwhile, from FIG. 17, around the standard value of load capacitance $C_L$, 6 pF, load capacitance $C_L$ must be controlled to be in the range from 1.9 pF to 7.2 pF to achieve the above compensation. In practice, the parasitic capacitance of the input/output portion of the IC is about 1 pF (at the pad or the protection circuit), and therefore as only for the variable capacitance element, the capacitance must be controlled between 0.9 pF to 6.2 pF. At present, it is substantially impossible to control the capacitance ratio of 6.2 pF/0.9 pF=6.89 using a variable capacitor stored in the IC, and with low power supply voltage.

What is generally practiced at present is as follows. The load capacitance $C_L$ of an oscillation circuit 181 shown in FIG. 18 is made of a capacitor array 182 as shown in FIG. 19. Switching elements $SW_0$ to $SW_{n-1}$ are turned on/off to selectively connect capacitive elements $C_0$ to $C_{n-1}$ to the oscillation circuit 181 and control load capacitance $C_L$. An analog signal output from a temperature detector 183 is converted into a digital signal by an A/D converter 184, compensation data is read out from a memory 185 using the digital signal as an address, and the switching elements $SW_0$ to $SW_{n-1}$ are turned on/off based on the compensation data.

Compensation is carried out for each predetermined temperature step, and therefore errors on both limits of the temperature range increase when the temperature range expands. In order to reduce the errors, the temperature step width must be reduced, which increases the bit number of the memory 185. This is illustrated in FIGS. 20 and 21. The minimum control unit of the capacitor array 182 in FIG. 19 must also be reduced, which also increases the bit number of the memory 185.

According to the conventional method, the load capacitance (capacitors) $C_L$ of the oscillation circuit is arranged in an array form and controlled by turning on/off the switching elements. According to this method, in order to improve the adjusting precision, the area size of the capacitor array and the bit number of memory are inevitably increased. This makes it difficult to reduce the cost.

SUMMARY OF THE INVENTION

It therefore an object of the present invention to provide a temperature compensated oscillator keeping the area of the capacitor array and the bit number of the memory from increasing and allowing for high precision and an adjusting method thereof.

Preferably, a temperature compensated oscillator according to the present invention includes a temperature detector that outputs an analog signal depending on a temperature, an A/D converter for converting the analog signal from the temperature detector into a digital signal, a memory from which compensation data is read out using the digital signal from the A/D converter as an address, a capacitor array for selectively connecting a plurality of capacitive elements to an oscillation circuit based on the compensation data, the oscillation circuit causing a resonator such as a crystal resonator to oscillate thereby generating an oscillation output signal, and using the capacitor array as a frequency adjusting element for the oscillation output signal, a frequency comparison circuit for comparing the frequencies of an externally input reference frequency signal and the oscillation output signal, a register in which the value of each bit is sequentially determined based on the frequency comparison result from the frequency comparison circuit, a switching circuit for selectively supplying the compensation data read out from the memory and a digital signal output from the register to the capacitor array, a voltage variable capacitive element connected to the capacitor array, and a control voltage generation circuit for generating control voltage to control the capacitance of the voltage variable capacitive element in response to the analog signal from the temperature detector. The digital signal output from the register is supplied to the capacitor array through the switching circuit and the plurality of capacitive elements are connected to the oscillation circuit in response to the digital signal, so that the oscillation circuit carries out oscillation operation. The value of each bit in the register is sequentially determined based on the comparison result for each comparison operation by the frequency comparison circuit to change the frequency of the oscillation output signal. The digital signal output from the register when the frequency of the oscillation output signal from the oscillation circuit is matched with a particular frequency is written in the memory as the compensation data corresponding to the detection temperature that can be addressed using the digital signal output from the A/D converter corresponding to the temperature detected by the temperature detector at the time, so that the writing operation is carried out for each temperature step.

Preferably, in the above temperature compensated oscillator, a point where a prescribed frequency difference is generated between the oscillation output signal and the external reference frequency signal is regarded as a breakpoint between the temperature steps.

Preferably in the above temperature compensated oscillator, in a first process a point where a prescribed frequency difference is generated between the oscillation output signal and the external reference frequency signal is regarded as a breakpoint between the temperature steps, and the frequency of the oscillation output signal is matched to the frequency of the external reference frequency signal, while in a second process a point where there is substantial coincidence between the frequency of the oscillation output signal and the frequency of the external reference frequency signal is regarded as a breakpoint between the temperature steps, and the frequency of the oscillation output signal is matched to a frequency shifted from the external reference frequency signal by the prescribed frequency difference, and the first and second processes are switched at a particular temperature. Also preferably, in this temperature compensated oscillator, the frequency of the external reference frequency signal is set to a frequency shifted from a desired frequency by half of the prescribed frequency difference. Here, also preferably, the frequency of the external reference frequency signal is prevented from being shifted in the vicinity of the particular temperature. Furthermore, the resonator is preferably a tuning fork type crystal resonator and the particular temperature is preferably a peak temperature in the frequency-temperature characteristic of the resonator.

Preferably, a temperature compensated oscillator according to the present invention includes a capacitor array having a plurality of selectively connected capacitive elements forming a variable capacitance, a voltage variable capacitive element connected to the capacitor array and forming a load capacitance with the capacitor array, a temperature detector that generates an output voltage depending on a temperature, a control voltage generation circuit for generating control voltage for temperature compensation to control the voltage variable capacitive element based on the output voltage of the temperature detector, a memory storing compensation data for each of a plurality of temperature steps, and a control circuit responsive to the output voltage of the temperature detector for reading out the compensation data corresponding to the temperature from the memory and connecting a corresponding one of the capacitive elements of the capacitor array based on the compensation data. Also preferably, a resonator assumed to have a frequency-temperature characteristic symmetric with respect to a peak temperature in a temperature range for temperature compensation is used, and the control voltage generation circuit generates control voltage having a temperature characteristic symmetric with respect to the peak temperature in the frequency-temperature characteristic of the crystal resonator.

Preferably, by a method of adjusting a temperature compensated oscillator according to the present invention, the temperature compensated oscillator includes a temperature detector that outputs an analog signal depending on a temperature, an A/D converter for converting the analog signal from the temperature detector into a digital signal, a memory from which compensation data is read out using the digital signal from the A/D converter as an address, a capacitor array for selectively connecting a plurality of capacitive elements to an oscillation circuit based on the compensation data, the oscillation circuit causing a resonator such as a crystal resonator to oscillate thereby generating an oscillation output signal, and using the capacitor array as a frequency adjusting element for the oscillation output signal, a frequency comparison circuit for comparing the frequencies of an externally input reference frequency signal and the oscillation output signal, a register in which the value of each bit is sequentially determined based on the frequency comparison result from the frequency comparison circuit, and a switching circuit for selectively supplying the compensation data read out from the memory and a digital signal output from the register to the capacitor array. The digital signal output from the register is supplied to the capacitor array through the switching circuit and the plurality of capacitive elements are connected to the oscillation circuit in response to the digital signal, so that the oscillation circuit carries out oscillation operation. The value of each bit in the register is sequentially determined based on the comparison result for each comparison operation by the frequency comparison circuit to change the frequency of the oscillation output signal, the digital signal output from the register when the frequency of the oscillation output signal from the oscillation circuit is matched with a particular frequency is written in the memory as the compensation data corresponding to the detection temperature that can be addressed using the digital signal output from the A/D converter corresponding to the temperature detected by the temperature detector at the time, so that the writing operation is carried out for each temperature step.

Preferably in the above adjusting method, a point where a prescribed frequency difference is generated between the oscillation output signal and the external reference frequency signal is regarded as a breakpoint between the temperature steps.

Preferably in the above adjusting method, in a first process a point where a prescribed frequency difference is generated between the oscillation output signal and the external reference frequency signal is regarded as a breakpoint between the temperature steps, and the frequency of the oscillation output signal is matched to the frequency of the external reference frequency signal, while in a second process a point where there is substantial coincidence between the frequency of the oscillation output signal and the frequency of the external reference frequency signal is regarded as a breakpoint between the temperature steps, and the frequency of the oscillation output signal is matched to a frequency shifted from the external reference frequency signal by the prescribed frequency difference, and the first and second processes are switched at a particular temperature. Also preferably in the above adjusting method, the frequency of the external reference frequency signal is set to a frequency shifted from a desired frequency by half of the prescribed frequency difference. Also preferably in the above adjusting method, the frequency of the external reference frequency signal is prevented from being shifted in the vicinity of the particular temperature. Furthermore, the particular temperature is preferably a peak temperature in the frequency-temperature characteristic of the resonator.

Preferably, an integrated circuit for temperature compensated oscillator corresponding to the above temperature compensated oscillator and the adjusting method thereof is provided.

DESCRIPTION OF THE PREFERRED EMBODIMENTS

Embodiments of the present invention will now be described in detail in conjunction with the accompanying drawings.

A temperature compensated oscillator and an adjusting method thereof according to a first embodiment of the invention will now be described. According to a first aspect of the invention, a capacitor array and a voltage-variable capacitive element are connected and used as a load capacitance in an oscillation circuit. In this way, the capacitance value of the capacitor array is digital-controlled, and the capacitance value of the voltage variable capacitive element is analog-controlled, so that the amount of compensation data that is necessary for the digital control is reduced, while highly precise temperature compensation can be carried out. This aspect will be described with reference to the first embodiment.

Figure 1:
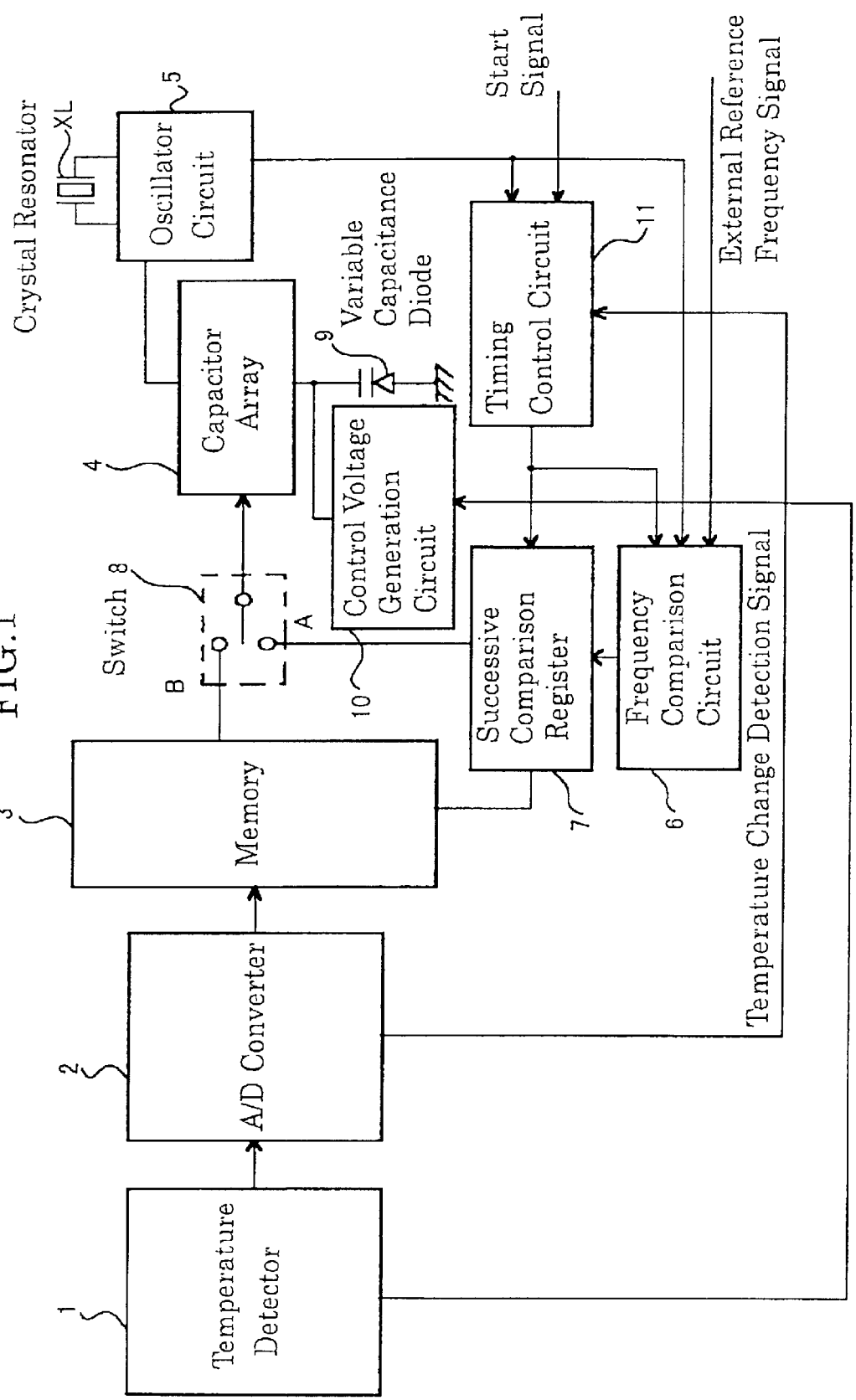
FIG. 1 is a block diagram of the configuration of a temperature compensated oscillator according to a first embodiment of the present invention.

FIG. 1 is a block diagram of the first embodiment. The configuration of the embodiment will now be described. A temperature detector 1 outputs an analog signal based on the temperature. An A/D converter 2 converts the analog signal from the temperature detector 1 into a digital signal. A memory 3 stores compensation data for temperature compensation, and the compensation data is read out using the digital signal from the A/D converter 2 as an address. A capacitor array 4 selectively connects a plurality of capacitive elements to an oscillation circuit 5 based on the compensation data read out from the memory 3. The oscillation circuit 5 causes a crystal resonator XL to oscillate and generate an oscillation output signal, and the capacitor array 4 serves as a frequency adjusting element for the oscillation output signal. According to the embodiment, a tuning fork crystal resonator is used as the crystal resonator XL. A frequency comparison circuit 6 compares the frequencies of an externally input reference frequency signal and the oscillation output signal. A successive comparison register 7 sequentially determines the value of each bit based on the result of frequency comparison by the frequency comparison circuit 6. A switch 8 serving as a switching circuit selectively supplies the compensation data read out from the memory 3 and the digital signal output from the successive comparison register 7 to the capacitor array 4. A variable capacitance diode 9 serving as a voltage variable capacitive element is connected with the capacitor array 4. A control voltage generation circuit 10 generates control voltage for the variable capacitance diode 9 based on the analog signal from the temperature detector 1. A timing control circuit 11 as will be detailed controls the process of setting compensation data for each temperature step based on the analog signal from the temperature detector 1. The temperature compensated oscillator according to the embodiment includes the above elements and the crystal resonator XL is externally provided. The other elements than the crystal resonator XL are integrated on a one-chip IC.

Figure 2:
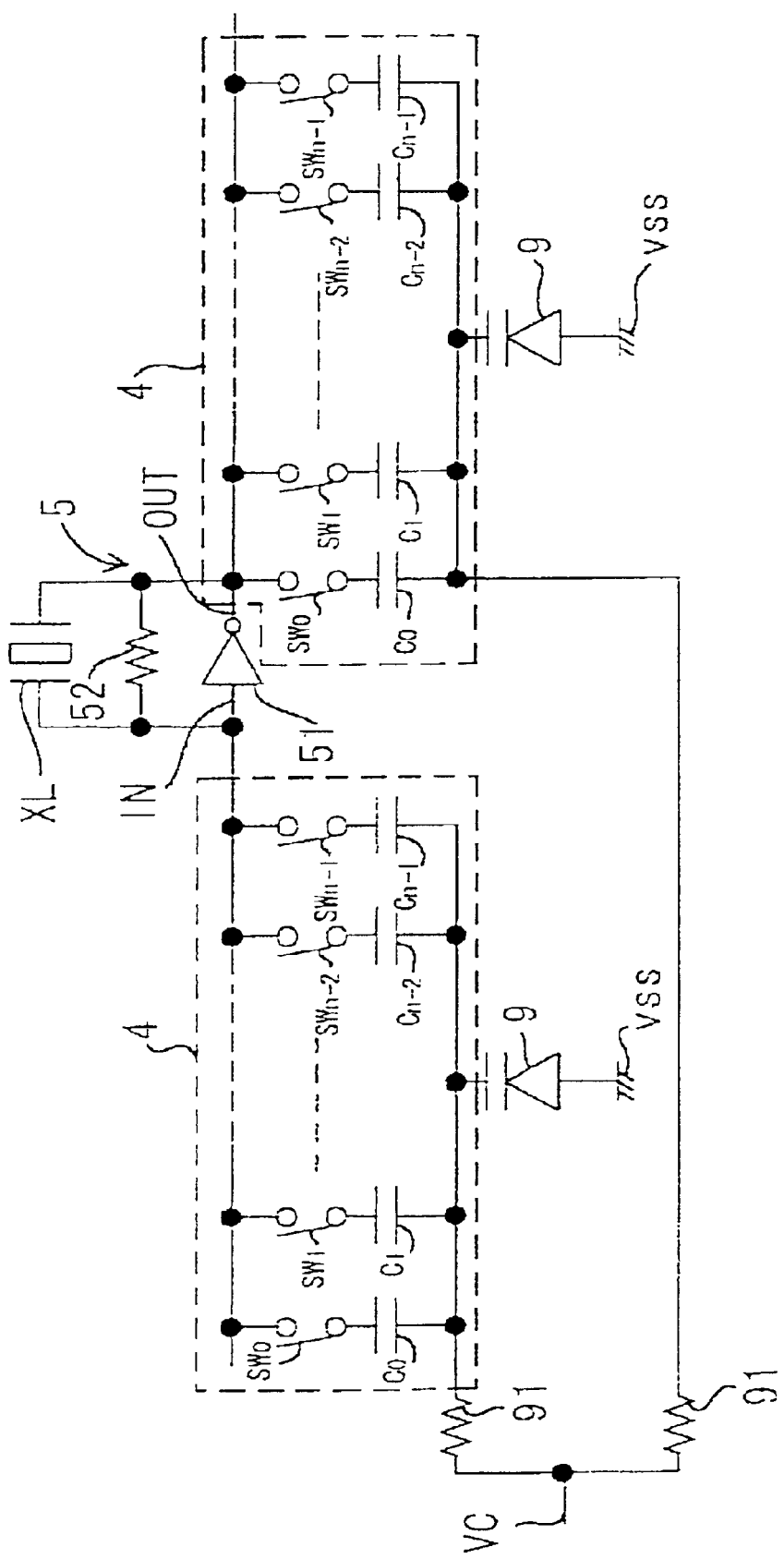
FIG. 2 is an electric circuit diagram showing the configuration of a capacitor array, a variable capacitance diode, and an oscillation circuit in the temperature compensated oscillator shown in FIG. 1.

According to the embodiment, the capacitor array 4 and the variable capacitance diode 9 are connected in series as a load capacitance for the oscillation circuit 5, which is shown in detail in FIG. 2. The oscillation circuit 5 includes a COMS inverter 51, and a feedback resistor 52 connected between the input and output terminals IN and OUT of the CMOS inverter 51, and a crystal resonator XL is connected between the input and output terminals IN and OUT. Capacitor arrays 4, 4 and variable capacitance diodes 9, 9 are connected in series between the input terminal IN and a power supply terminal VSS (0V for example) and between the output terminal OUT and a power supply terminal VSS, respectively. This allows the capacitor arrays 4, 4 and variable capacitance diodes 9, 9 to serve as a load capacitance in the oscillation circuit 5. Note that the series circuit including the capacitor array 4 and the variable capacitance diode 9 is provided at both input and output terminals IN and OUT. Meanwhile, the circuit may be provided only at one of the terminals.

The capacitor arrays 4 each include n (n: positive integer) capacitive elements $C_0$ to $C_{n-1}$ and n switching elements $SW_0$ to $SW_{n-1}$. A capacitive element $C_k$ (k: integer from 0 to n−1) and a switching element $SW_k$ are connected in series. These series connections are connected in parallel. The switching elements $SW_0$ to $SW_{n-1}$ are selectively turned on and off based on the compensation data. In other words, in response to the logical level of each bit in the compensation data, i.e., "0" or "1" the capacitive elements connected to the switching elements are selectively connected to the oscillation circuit 5. The number n of capacitive elements is determined as desired based on the compensation data, or the precision of the temperature compensation.

The variable capacitance diodes 9 each have a cathode connected to the connection nodes of the capacitive elements $C_0$ to $C_{n-1}$, and an anode connected to a power supply terminal VSS, and receive control voltage VC at the cathode through a resistor 91. The control voltage VC applied to the variable capacitance diode 9 has a shape produced by folding the output of the temperature detector 1 that is substantially linearly reduced based on the temperature at the peak temperature position of the frequency-temperature characteristic of the crystal resonator XL. This can be implemented by forming the control voltage generation circuit 10 as shown in FIG. 3.

Figure 3:
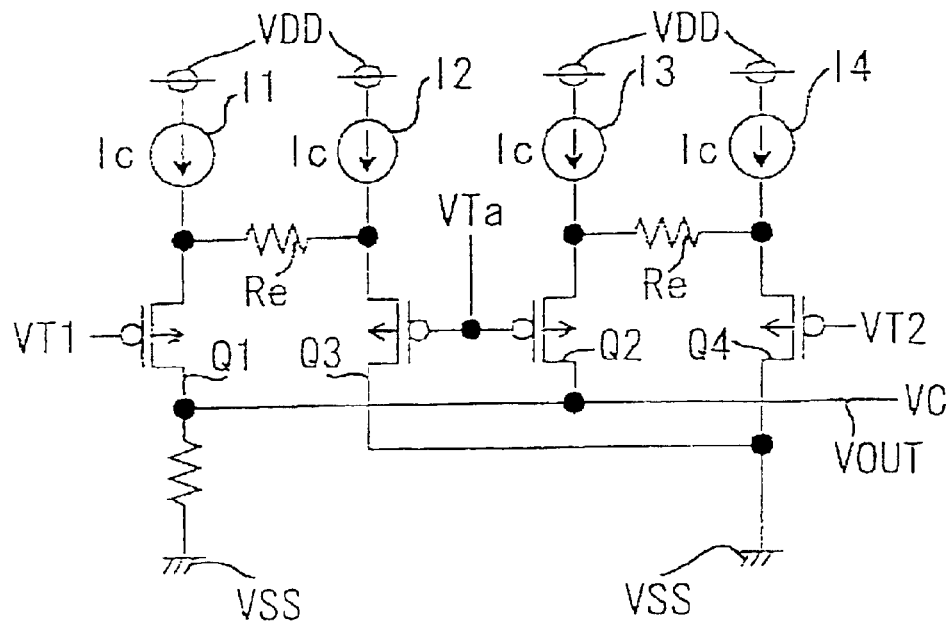
FIG. 3 is an electric circuit diagram showing the configuration of a control voltage generation circuit in the temperature compensated oscillator shown in FIG. 1.

In the control voltage generation circuit 10 shown in FIG. 3, the sources of P-channel MOS transistors Q1 to Q4 are connected with constant current sources I1 to I4, respectively. The constant current sources I1 to I4 are connected to the power supply terminal VDD (3V for example) and each output prescribed current Ic. The P-channel MOS transistors Q1 and Q2 have their drains connected with each other, and the connection node is connected to the power supply terminal VSS through a resistor Rc. The connection node of the P-channel MOS transistors Q1 and Q2 is provided with a terminal VOUT to output the control voltage VC. The P-channel MOS transistors Q3 and Q4 have their drains connected with each other and the connection node is connected to the power supply terminal VSS. A resistor Re is connected between the sources of the P-channel MOS transistors Q1 and Q3, and another resistor Re is connected between the sources of the P-channel MOS transistors Q2 and Q4. The analog signal from the temperature detector 1, i.e., the output voltage VTa is applied to the gates of the P-channel MOS transistors Q2 and Q3. The P-channel MOS transistor Q1 and Q4 are provided with voltages VT1 and VT2, respectively at their gates. These voltages VT1 and VT2 are generated by a reference voltage generation circuit that is not shown. The voltage VT1 is substantially the intermediate voltage between the output voltages from the temperature detector 1 at the lower limit temperature and the peak temperature of the temperature range for temperature compensation. The voltage VT2 is substantially the intermediate voltage between the output voltages from the temperature detector 1 at the upper limit temperature and the peak temperature of the temperature range.

Figure 4:
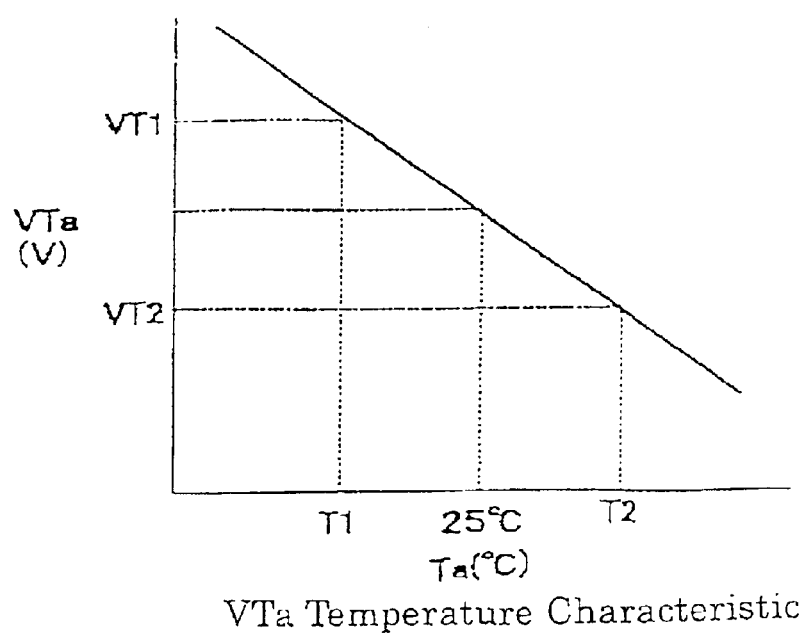
FIG. 4 is a chart showing the temperature characteristic of an output voltage from a temperature detector in the temperature compensated oscillator shown in FIG. 1.
Figure 5:
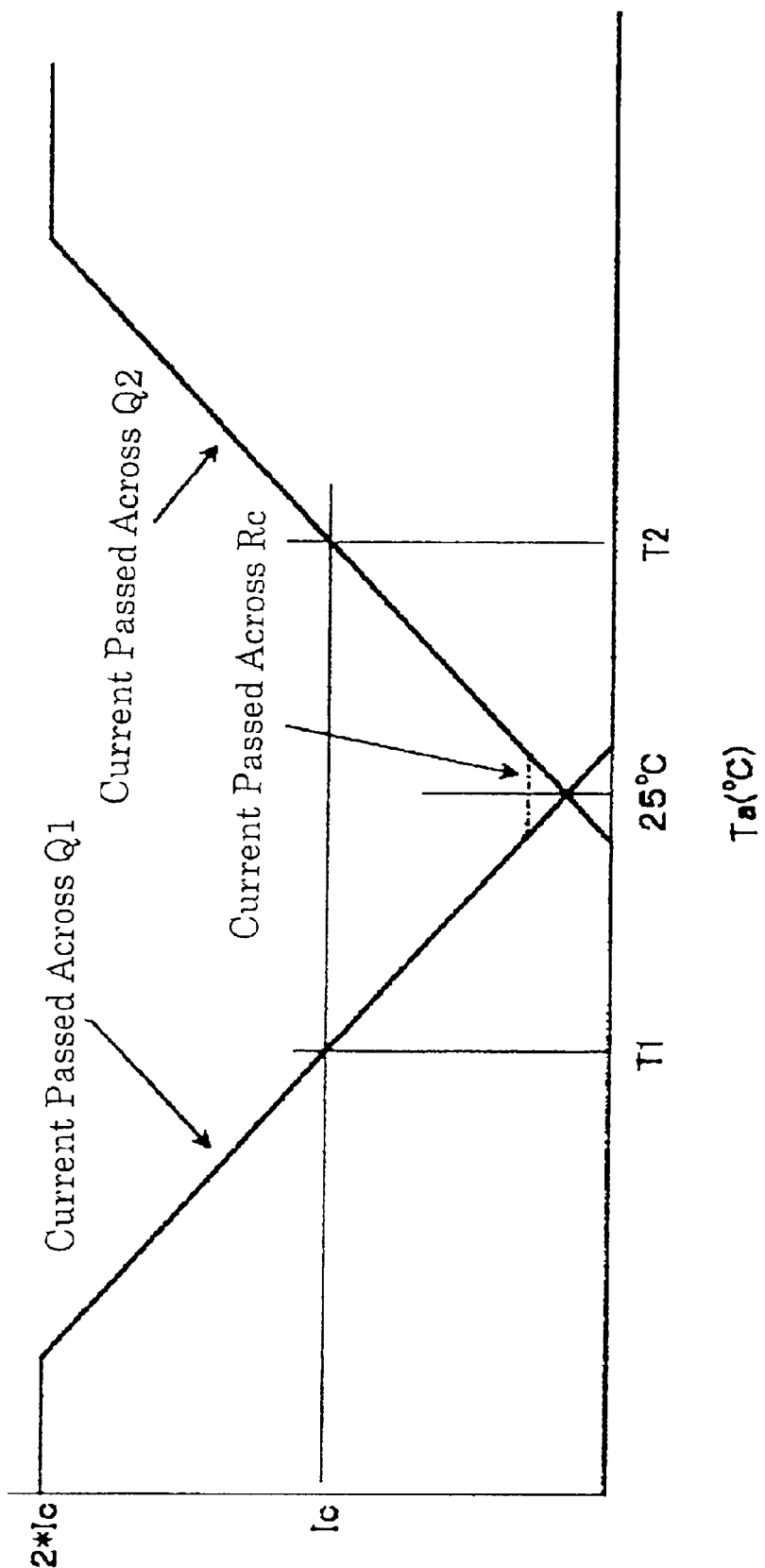
FIG. 5 is a chart showing the temperature characteristic of current passed across a transistor forming the output part of the control voltage generation circuit in the temperature compensated oscillator shown in FIG. 3.

FIG. 4 shows the relation between the temperature characteristic of the voltage VTa and voltages VT1 and VT2 and FIG. 5 shows the temperature characteristic of current passed across the P-channel MOS transistors Q1 and Q2 and the resistor Rc. In FIGS. 4 and 5, the peak temperature is 25° C., the temperatures at which the temperature detector 1 outputs the voltages VT1 and VT2 are denoted as T1 and T2, respectively. The temperature characteristic of the current across the P-channel MOS transistor Q1 is as follows. The lower the temperature is than T1, the higher is the on-resistance of the P-channel MOS transistor Q3 than that of the P-channel MOS transistor Q1. The current from the constant current source I3 is passed to the P-channel MOS transistor Q1 through the resistor Re, and the current passed through the P-channel MOS transistor Q1 increases. At the temperature T1, the on-resistances of the P-channel MOS transistors Q1 and Q2 are balanced, so that no current is passed across the resistor Re. The higher the temperature is than T1, the lower is the on-resistance of the P-channel MOS transistor Q3 than that of the P-channel MOS transistor Q1. Therefore, the current from the constant current source I1 is passed across the resistor Re to the P-channel MOS transistor Q3, so that the current passed across the P-channel MOS transistor Q1 is reduced.

The temperature characteristic of the current passed across the P-channel MOS transistor Q2 is as follows. The lower the temperature is than T2, the lower is the on-resistance of the P-channel MOS transistor Q4 than that of the P-channel MOS transistor Q2. The current from the constant current source I3 is passed to the P-channel MOS transistor Q4 through the resistor Re, and current passed across the P-channel MOS transistor Q2 is reduced. At the temperature T2, the on-resistances of the P-channel MOS transistors Q2 and Q4 are balanced, so that no current is passed through the resistor Re. The higher the temperature is than T2, the higher is the on-resistance of the P-channel MOS transistor Q4 than that of the P-channel MOS transistor Q2, so that the current from the constant current source I4 is passed across the P-channel MOS transistor Q2 through the resistor Re. In this way, current passed across the P-channel MOS transistor Q2 increases.

Figure 6:
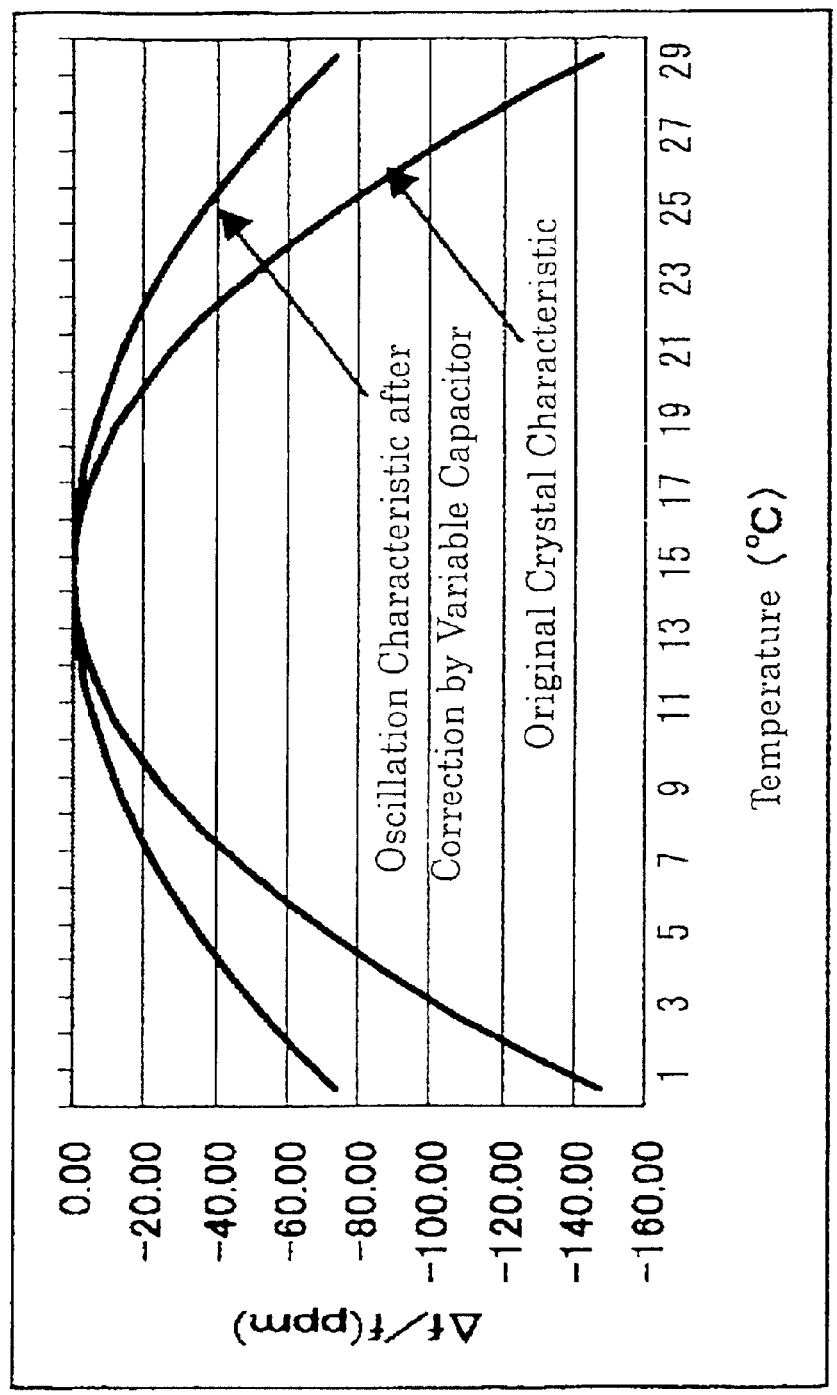
FIG. 6 is a chart showing a frequency-temperature characteristic before and after temperature compensation using a variable capacitance diode.

The currents across the P-channel MOS transistors Q1 and Q2 as described above are combined and passed across the resistor Rc, and the control voltage VC takes a value produced by multiplying the resultant current value by the resistance value of the resistor Rc. In this way, the control voltage VC having the temperature characteristic in a shape folded at the peak temperature results. When the capacitor array 4 is fixed in the state with the maximum capacitance value, and the control voltage VC is applied to the variable capacitance diode, the frequency-temperature characteristic has reduced temperature dependence as shown in FIG. 6. As the temperature dependence is thus reduced, the width of correction by the capacitor array 4 can be reduced, so that the size of the capacitor array 4 and the memory 3 can be reduced.

Figure 7:
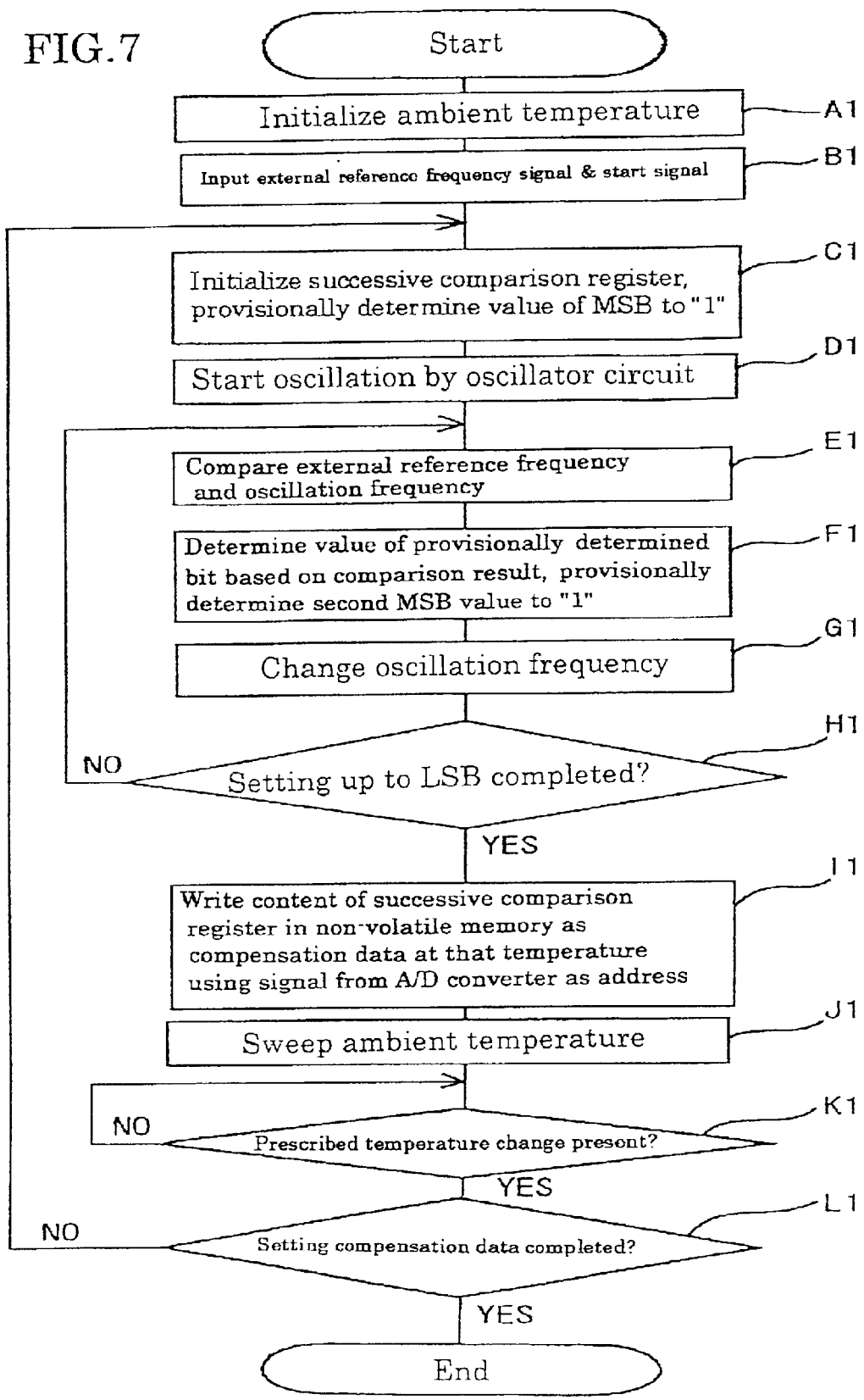
FIG. 7 is a flowchart for use in illustration of a compensation data setting processing in a method of adjusting the temperature compensated oscillator according to the first embodiment.

A method of adjusting the temperature compensated oscillator according to the embodiment and the operation of the temperature compensated oscillator will now be described with reference to the flowchart in FIG. 7. In the temperature compensated oscillator shown in FIG. 1, the capacitor array 4 is fixed in the state with the maximum capacitance value, and the control voltage VC is applied to the variable capacitance diode 9. In this way, the oscillation frequency becomes less dependant on the temperature as shown in FIG. 6. In this state, the switch 8 is connected to the side of terminal A and the whole device of the temperature compensated oscillator is placed in a constant temperature chamber. The constant temperature chamber is set to a prescribed temperature, 95° C. for example and allowed to be sufficiently stabilized at the temperature (step A1). Note that the prescribed temperature is on the higher or lower temperature side from the temperature range desired by compensation in view of an estimated variation for the temperature detecting means. Then, a start signal is applied to the timing control circuit 11 externally from the temperature compensated oscillator, and an external reference frequency signal is applied to the frequency comparison circuit 6 to start the compensation data setting operation (step B1).

When the compensation data setting operation is started, the timing control circuit 11 sets the most significant bit of the successive comparison register 7 to "1," and the lower order bits are set to "0" (step C1). In this state, only the switching element $SW_{n-1}$ connected to the capacitive element $C_{n-1}$ that corresponds to the most significant bit of the bits of the successive comparison register 7 is turned off. (The capacitive elements $C_0$ to $C_{n-1}$ are weighted corresponding to the bits.) Since only the most significant bit of the successive comparison register 9 is set to "1," the capacitance value of the capacitor array 4 is the intermediate value in the variable range. The oscillation circuit 5 oscillates at a frequency corresponding to the value (step D1).

The timing control circuit 11 causes the frequency comparison circuit 6 to compare the oscillation output signal of the oscillation circuit 5 and the external reference frequency signal (step E1). The frequency comparison circuit 6 counts the external reference frequency signal and the oscillation output signal from the oscillation circuit 5 for a prescribed period and determines the size of the count values. If the oscillation frequency of the oscillation circuit 5 is lower than the reference frequency of the external reference frequency signal, "1" is output and otherwise "0" is output.

The frequency comparison circuit 6 determines the value of the bit of the successive comparison register 7 provisionally determined as "1" based on the comparison result of the frequency comparison circuit 6, and the value of the next bit on the lower order side is provisionally set to "1" (step F1). When the comparison result of the frequency comparison circuit 6 is "1," in other words, the oscillation frequency is lower than the reference frequency, the provisionally determined bit, i.e., the most significant bit in the initial state is determined to "1," and the second most significant bit is provisionally determined to "1." Then, the switching element $SW_{n-2}$ is turned off to lower the capacitance value of the capacitor array 4. Conversely, when the comparison result of the frequency comparison circuit 6 is "0," in other words, when the oscillation frequency is higher than the reference frequency, the most significant bit is determined to be "0" and the second most significant bit is provisionally set to "1" to raise the capacitance value. In this way, the oscillation frequency of the oscillation circuit 5 is changed (step G1).

The timing control circuit 11 determines whether or not the least significant bit of the successive comparison register 7 is determined (step H1), returns to step E1 if the least significant bit is not determined, and causes the frequency comparison circuit 6 to compare the oscillation output signal and the externally applied reference frequency signal (step E1). The bit whose value is provisionally determined based on the comparison result, the second most significant bit in this case is determined, and the next most significant bit, the third most significant bit in this case is provisionally determined to be "1" (step F1). Then, the oscillation frequency of the oscillation circuit 5 is changed (step G1). In this way, steps E1 to H1 are repeatedly carried out to sequentially determine the values of the bits from the most significant bit to the lower order side, and the oscillation frequency is approximated to the frequency of the external reference frequency signal. The self-compensation operation allows the oscillation frequency to match the frequency of the external reference frequency signal when the least significant bit is determined. In this way, the oscillation frequency can highly precisely be matched to a prescribed frequency.

When all the bits of the successive comparison register 7 are determined, the output of the temperature detector 1 is converted into a digital signal by the A/D converter 2, which is then used as an address to write the content of each bit of the successive comparison register 7 in the memory 3 as compensation data corresponding to the temperature in the constant temperature chamber at the time (step I1).

In this way, while the configuration as the temperature compensated oscillation circuit is provided, the digital signal from the successive comparison register 7 is written in the memory 3 using as an address the digital signal obtained by A/D-converting the output of the temperature detector 1 and is used as compensation data. (The digital signal from the register 7 is extracted by the self-compensation operation and used to determine the capacitance value of the capacitor array 4 that allows the oscillation output signal at a prescribed frequency to be obtained in actual use.) Therefore, highly precise compensation data can be extracted independent of the temperature characteristic variations of the crystal resonator XL, the variable capacitance diodes 9, the A/D converter 2 and the like, or of the absolute precision of the temperature detector 1. In addition, a digital signal determining the connection of the capacitor array 4 for adjusting the oscillation frequency is determined for each bit by the self-compensation operation, so that highly precise compensation data can be obtained.

The operation of setting compensation data for each temperature step will now be described. The temperature set for the constant temperature chamber is gradually changed from the high temperature side to the low temperature side at a prescribed speed. (Hereinafter, the operation will be referred to as "sweeping.") (step J1).

The timing control circuit 11 receives the digital signal from the A/D converter 2, and in response to a prescribed change in the value of the signal, a prescribed temperature change, in other words, a prescribed temperature step is detected by the temperature detector 1 (step K1). It is determined whether or not all the compensation data for each prescribed temperature step is written in the memory 3 (step L1). Using this as a start signal, the operation from step C1 is carried out, and a digital signal from the successive comparison register 7 to achieve an oscillation output signal at a frequency substantially equal to the reference frequency is written in the memory 3 as the compensation data using as an address the digital signal produced by A/D-converting the output of the temperature detector 1. When a prescribed temperature change is detected by the temperature detector 1, compensation data for each temperature step starts to be extracted, the compensation data for each temperature step can be extracted independently of ambient temperatures of the temperature compensated oscillator, in other words, the temperature set for the constant temperature chamber. In this way, the cost and labor for controlling the temperature setting in the manufacture can be reduced.

As described above, the operation from steps C1 to L1 is repeated so that compensation data for each temperature step is written in the memory 3. When the compensation data has been written for all the temperature steps (step L1), the compensation data setting operation according to the embodiment ends (END).

In the embodiment described above, compensation data can be extracted and written into the memory 3 online. The compensation data including the characteristics of all the elements can be obtained, so that the precision can be improved.

In actual use, the switch 8 is connected to the side of the terminal B. The output of the temperature detector 1 output depending upon the ambient temperature is A/D-converted, and using the resulting digital signal as an address the compensation data is read out from the memory 3. The capacitance value of the capacitor array 4 is determined based on the data, and the frequency of an oscillation output signal from the oscillation circuit 5 is matched to that of the external reference frequency signal used at the time of manufacture.

Figure 21:
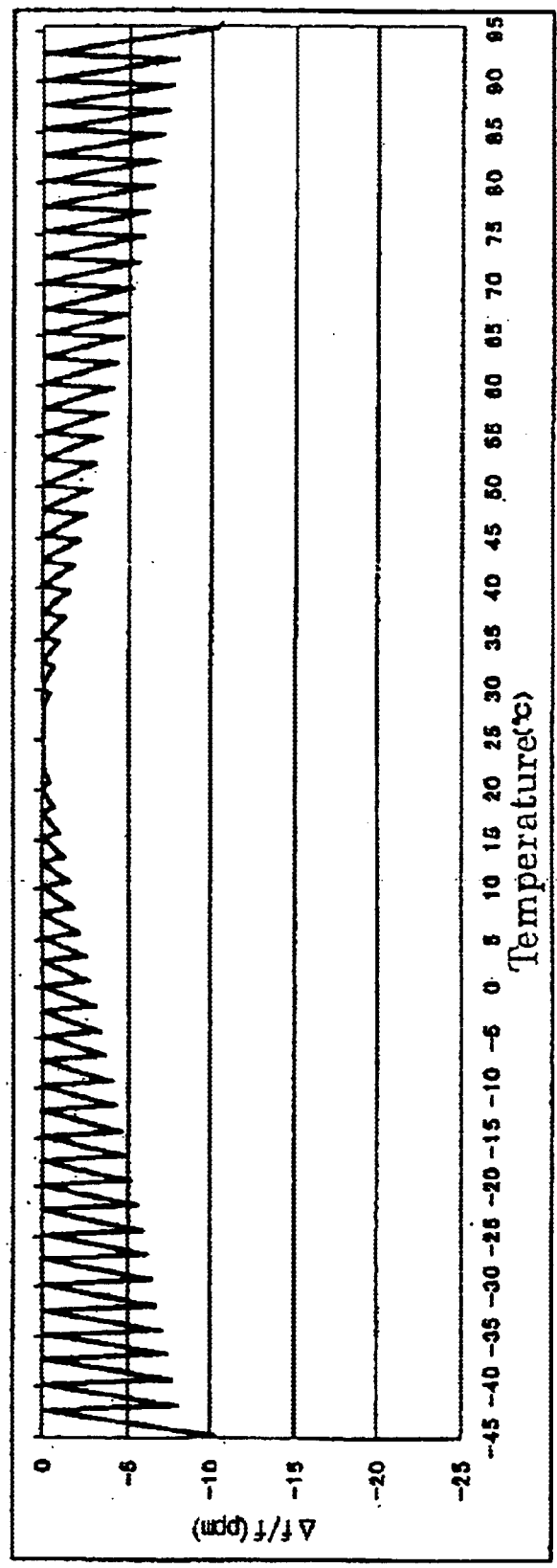
FIG. 21 is a chart showing a frequency-temperature characteristic when temperature compensation is carried out for each 2.5° C. using the temperature compensated oscillator shown in FIG. 18.

As for the frequency-temperature characteristic by the temperature compensation using the compensation data set as described above, as shown in FIG. 8, the final error in the compensation by the capacitor array 4 for each 5° C. for example is about the same as that in the compensation for each 2.5° C. as shown in FIG. 21. In this way, according to the embodiment, while the variable width of the capacitance value for the variable capacitance diode 9 integrated with other elements on a one-chip IC is small and the diode cannot carry out sufficient temperature compensation on its own, sufficient temperature compensation can be carried out when the variable capacitance diode is used together with the capacitor array. More specifically, the temperature dependence is alleviated by the use of the variable capacitance diode 9, which allows the capacitor array 4 and the memory 3 to have a practically available size. In addition, by the self extraction of the compensation data in the above manufacturing process, a highly precise temperature compensated oscillator can be provided.

A second embodiment of the invention will now be described. According to a second aspect of the present invention, the compensation by the capacitor array is carried out every time a particular frequency deviation is generated rather than for each prescribed temperature step, so that the number of points in the temperature for compensation is reduced.

Figure 9:
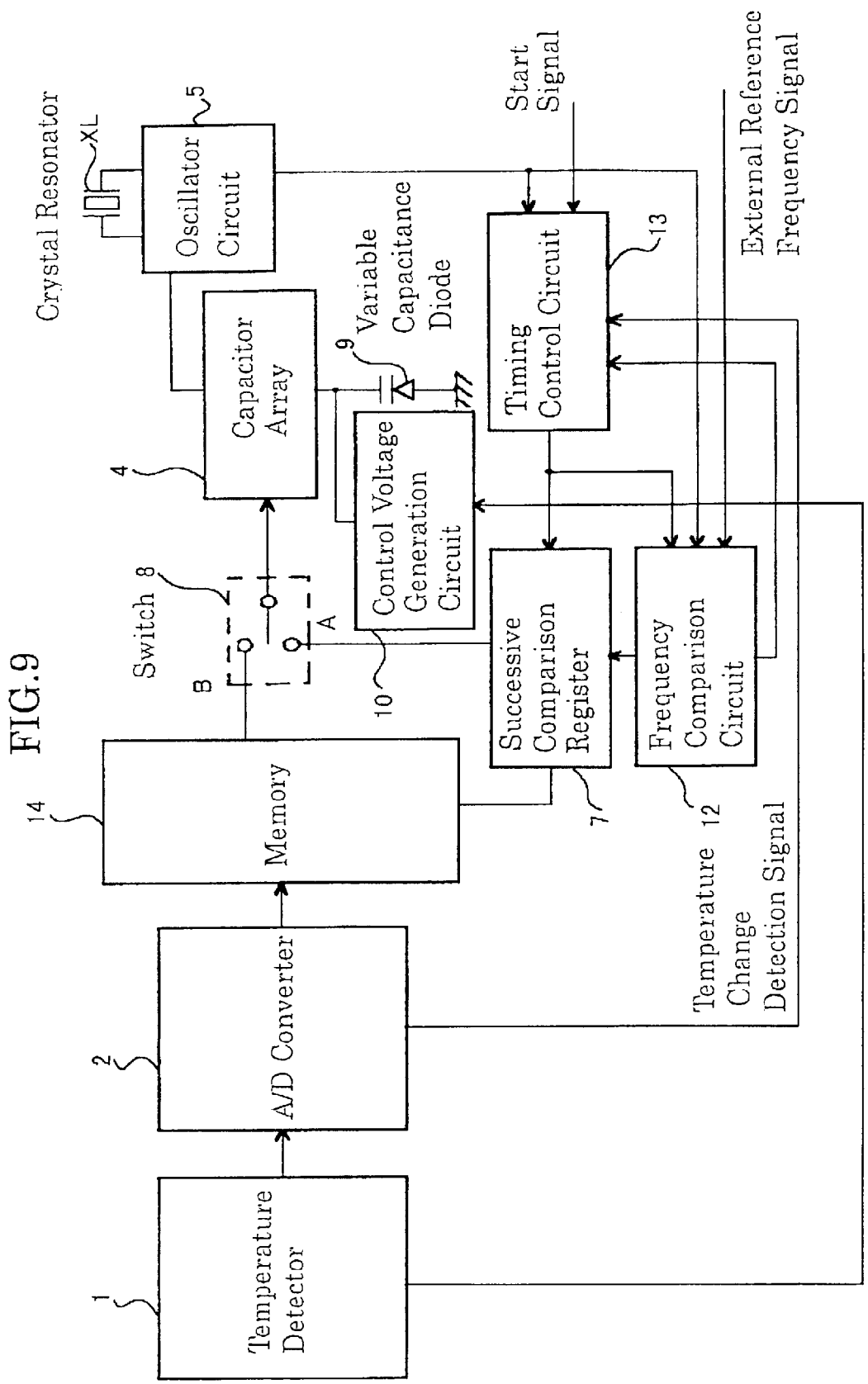
FIG. 9 is a block diagram of the configuration of a temperature compensated oscillator according to a second embodiment of the invention.

The configuration of the embodiment will be described. The temperature compensated oscillator has a configuration as shown in FIG. 9. In FIG. 9, the elements the same as those shown in FIG. 1 are denoted by the same reference numerals. According to the embodiment, a frequency comparison circuit 12 not only carries out the same frequency comparison operation as carried out by the frequency comparison circuit 6 in FIG. 1 but also detects the frequency deviation of the oscillation output signal of the oscillation circuit 5 from the external reference frequency signal being 10 ppm. A timing control circuit 13 is different from the timing control circuit 11 in FIG. 1 in that the circuit 13 monitors the detection output of the frequency deviation from the frequency comparison circuit 12, and operates so that the point where the frequency deviation becomes 10 ppm is a breakpoint between temperature steps. A memory 14 stores compensation data and a digital signal output from the A/D converter 2 when the compensation data is obtained as temperature data. The memory includes an address decoder that is not shown. When the temperature compensated oscillator according to the embodiment is used, the digital signal output by the A/D converter 2 is made to correspond to a compensated temperature step using the address decoder and corresponding compensation data is read out.

Figure 10:
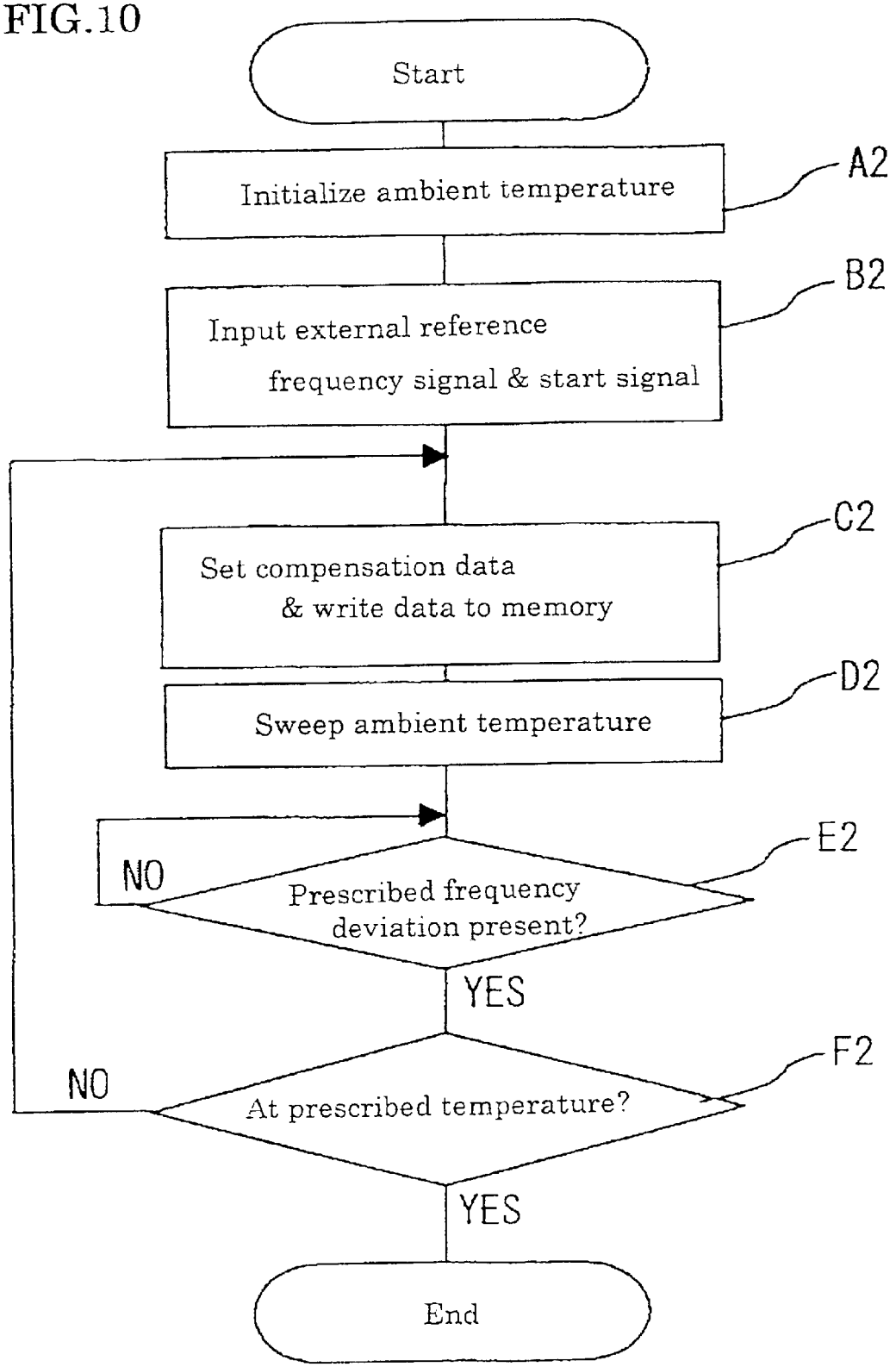
FIG. 10 is a flowchart for use in illustration of a compensation data setting processing by a method of adjusting a temperature compensated oscillator according to the second embodiment.

A method of adjusting the temperature compensated oscillator and the operation of the oscillator will now be described in conjunction with the flowchart in FIG. 10. In the temperature compensated oscillator shown in FIG. 9, the capacitor array 4 is fixed in the state with the maximum capacitor value, and control voltage VC is applied to the variable capacitance diode. In this state, the switch 8 is connected to the side of the terminal A and the whole device of the oscillator is placed in a constant temperature chamber set at a prescribed temperature, 95° C. and allowed to be sufficiently stabilized (step A2). Then, a start signal is applied to the timing control circuit 13 from outside the temperature compensated oscillator, the external reference frequency signal is applied to the frequency comparison circuit 12, and the operation of setting the compensation data is started (step B2).

When the compensation data setting operation is started, the process the same as that from steps C1 to H1 according to the first embodiment is carried out to set compensation data, and the resulting compensation data is written in the memory 14 together with temperature data output by the A/D converter 2 at the time (step C2).

Then, the operation of setting compensation data for each temperature step is carried out, and the temperature set in the constant temperature chamber is swept to the low temperature side at a prescribed speed (step D2). The timing control circuit 13 monitors the detection output of the frequency deviation from the frequency comparison circuit 12, determines that the frequency deviation is a prescribed value of 10 ppm in response to the detection output (step E2), and determines whether or not the output of the A/D converter 2 reaches a prescribed temperature in other words whether or not compensation data for each temperature step for example in the range from 95° C. to −45° C. is written in the memory 14 (step F2). Then, the operation of setting compensation data for the next temperature step is started. More specifically, the operation from step C2 is carried out to set compensation data and the data is written in the memory 14.

The temperature set for the constant temperature chamber is swept, and every time the detection output of the frequency deviation is generated from the frequency comparison circuit 12, in other words, every time the frequency deviation becomes 10 ppm, compensation data for the next temperature step is set. When compensation data has been written for all the temperature steps in the prescribed temperature range (step F2), the compensation data setting operation according to the embodiment ends (END). The temperature compensated oscillator according to the embodiment has the compensation data thus set by the process and is completed.

Figure 8:
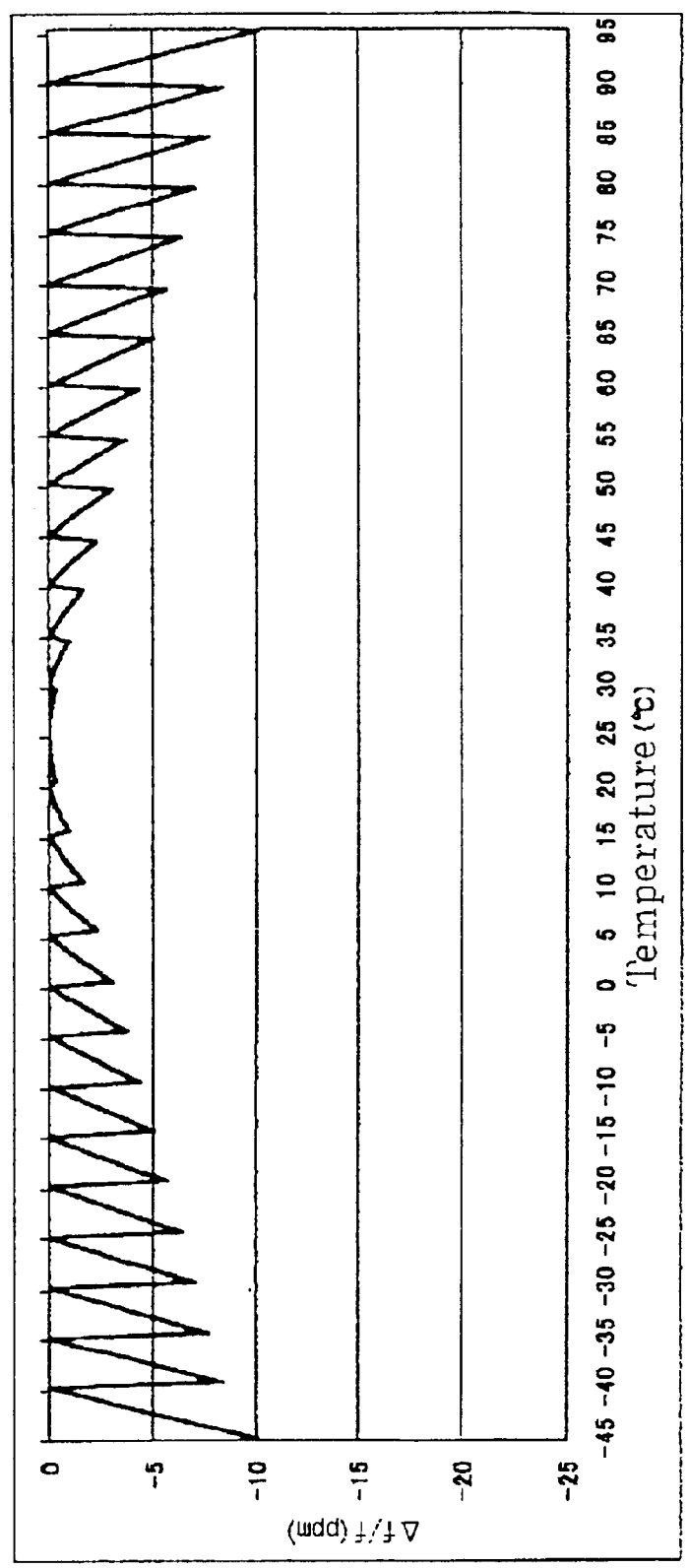
FIG. 8 is a chart showing a frequency-temperature characteristic after temperature compensation using compensation data by the temperature compensated oscillator according to the first embodiment.
Figure 11:
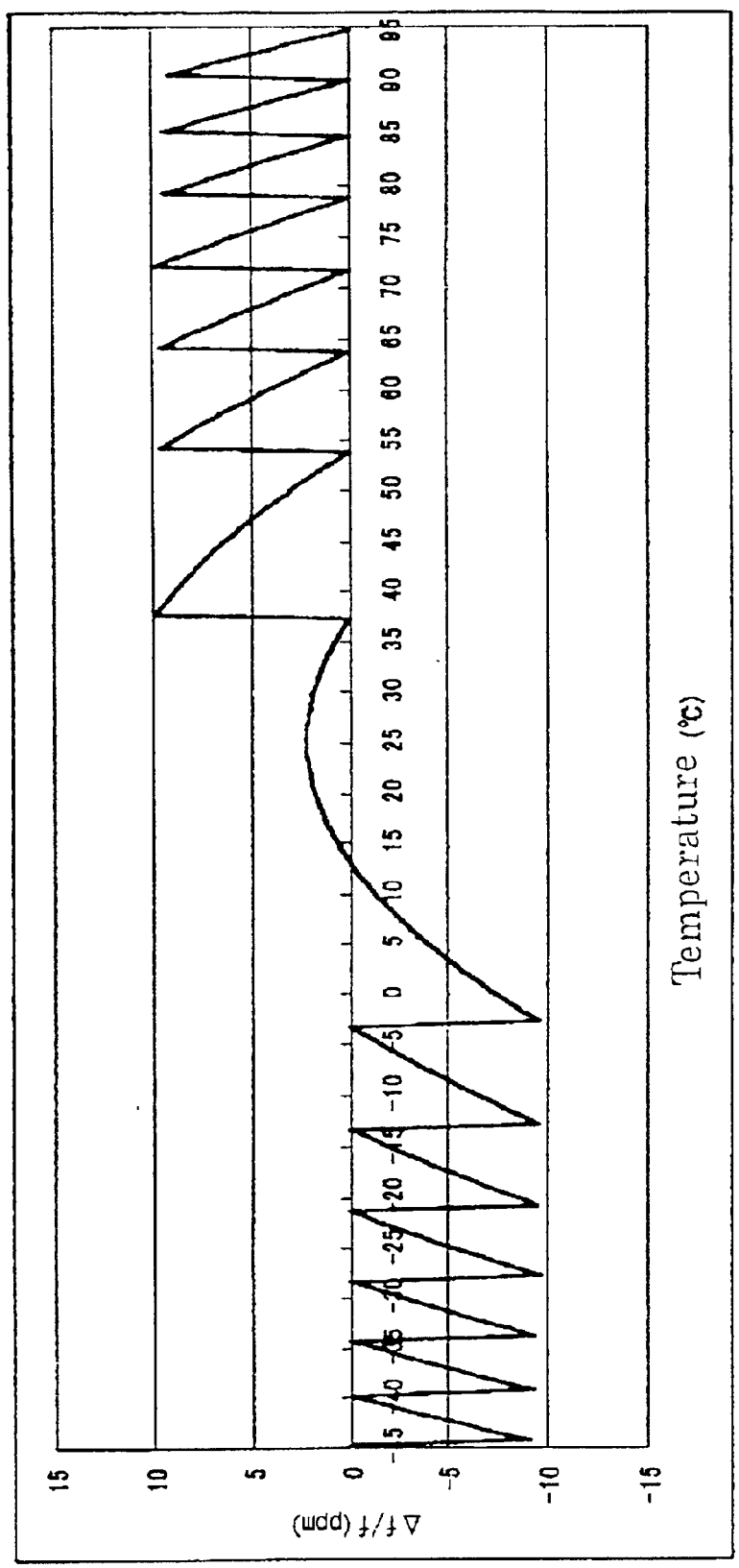
FIG. 11 is a chart showing a frequency-temperature characteristic after temperature compensation using compensation data by the temperature compensated oscillator according to the second embodiment.

The function and effects the same as those according to the first embodiment can be provided according to the second embodiment and the following additional effect is provided. The frequency-temperature characteristic obtained when the temperature is swept from the high temperature side to the low temperature side, and compensation is carried out every time a frequency deviation of 10 ppm is generated is shown in FIG. 11. When compensation is carried out at prescribed temperature intervals (5° C.) as shown in FIG. 8, compensation must be carried out in 27 temperature points in order to carry out the compensation in the ±10 ppm range for the entire temperature range. Meanwhile, as shown in FIG. 11, according to the embodiment, compensation is necessary only in about half the points, i.e., 14 points. In this case, the compensated temperature data should be stored at the same time, the bit number of the memory tends to increase, while the effect of halving the addresses is greater in reducing the area of the total memory portion including the address decoder. If only the difference from the previous compensation temperature is stored, the increase can be less.

Figure 16:
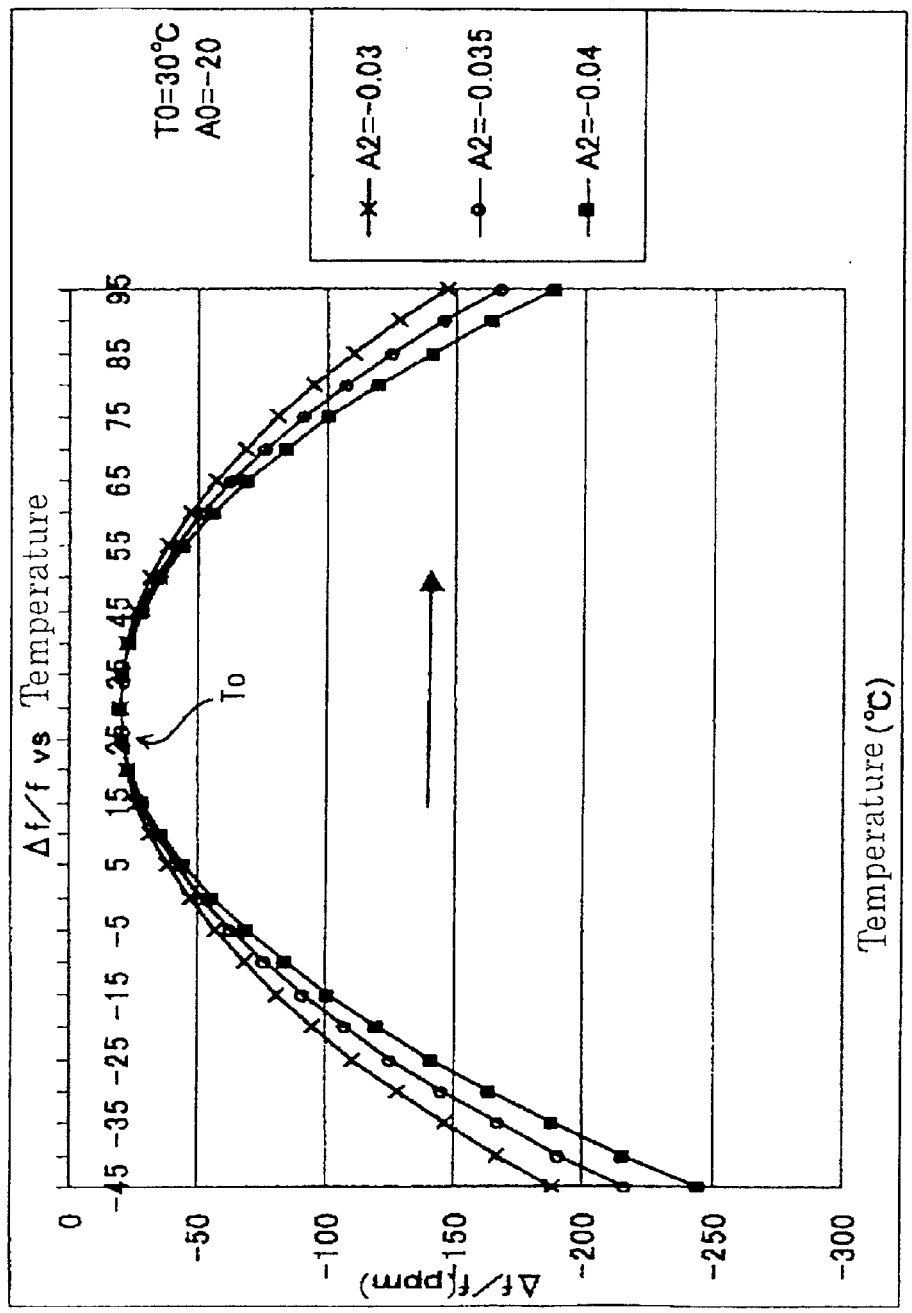
FIG. 16 is a chart showing a frequency-temperature characteristic of the resonance frequency of a tuning fork type crystal resonator.
Figure 17:
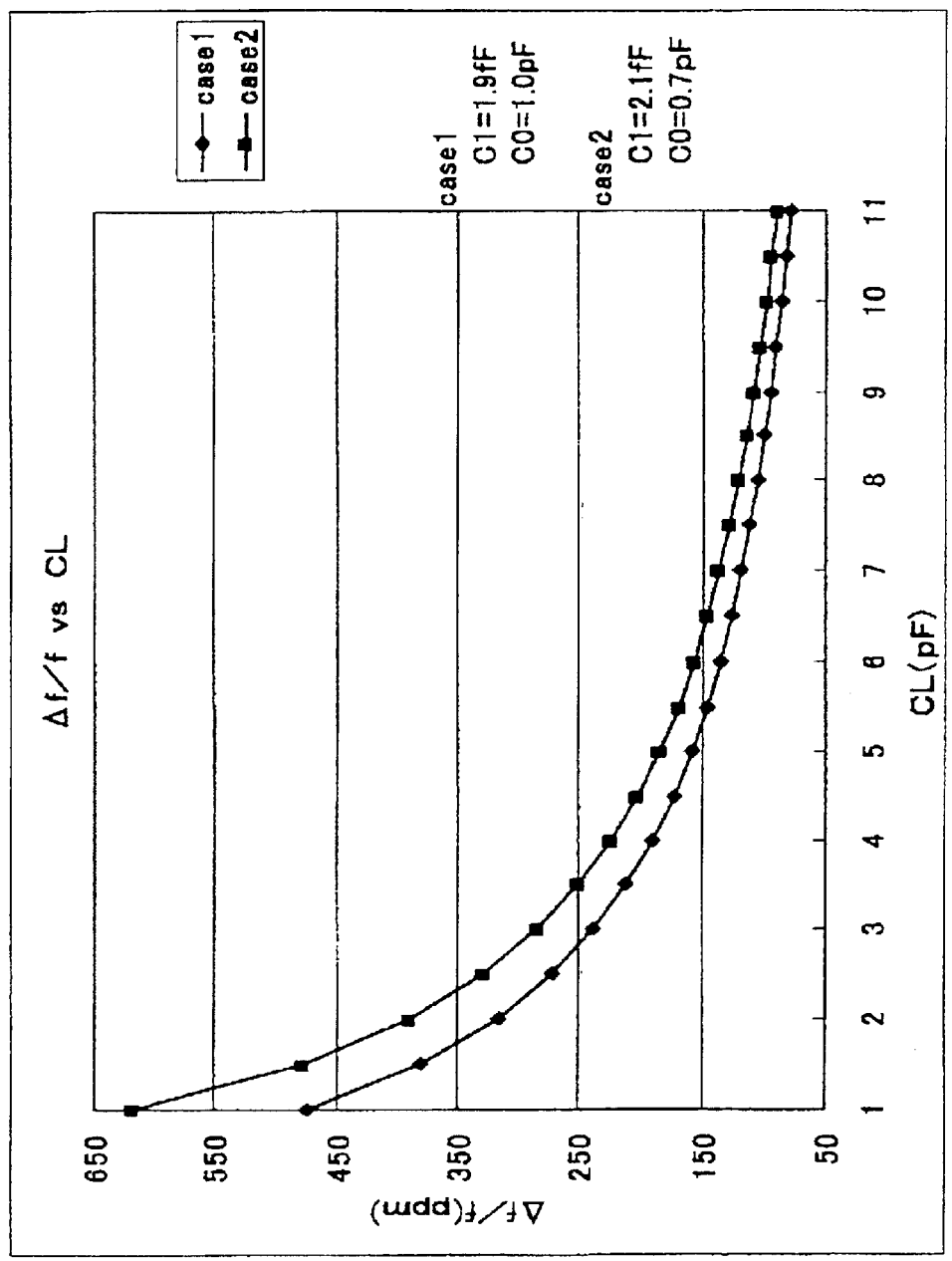
FIG. 17 is a chart showing the load capacitance-frequency characteristic of an oscillation circuit using a tuning fork type crystal resonator.
Figure 18:
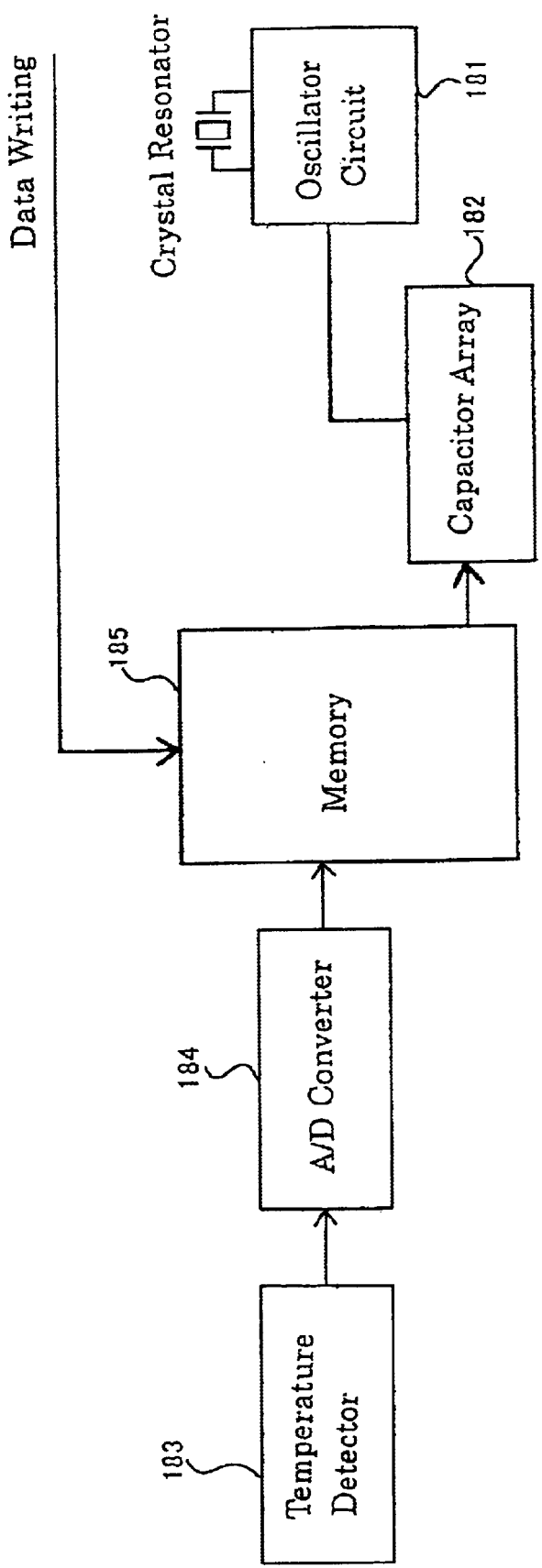
FIG. 18 is a block diagram showing the configuration of a conventional temperature compensated oscillator.
Figure 19:
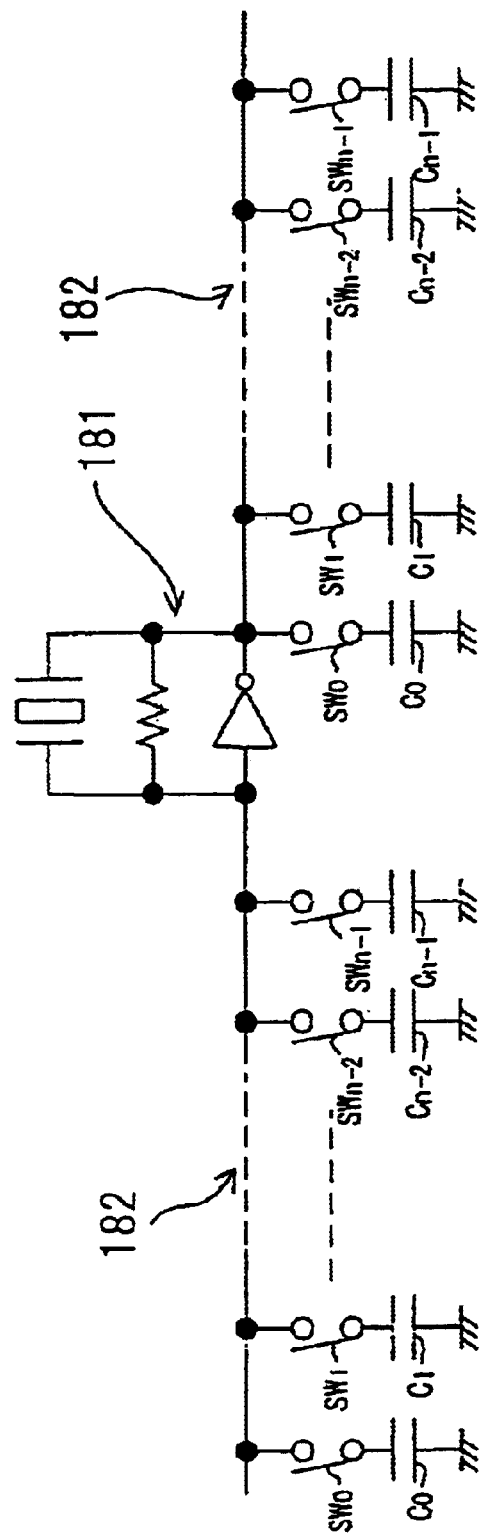
FIG. 19 is an electric circuit diagram showing the configuration of a capacitor array in the temperature compensated oscillator shown in FIG. 18.
Figure 20:
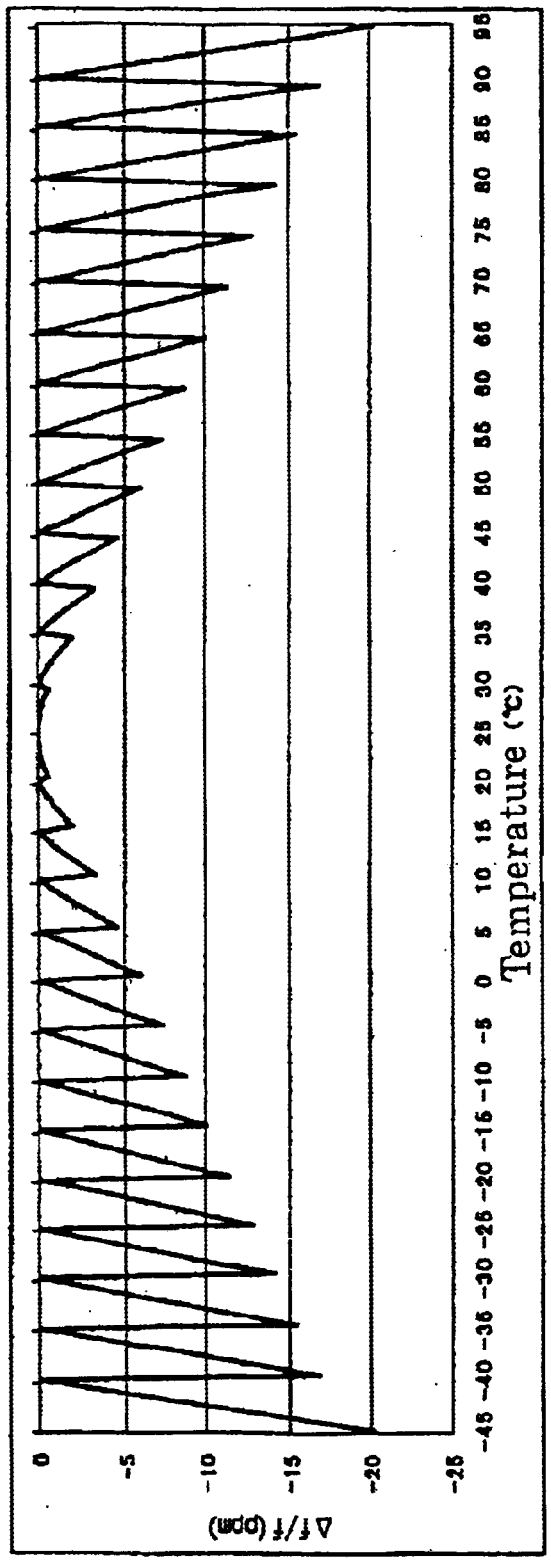
FIG. 20 is a chart showing a frequency-temperature characteristic when temperature compensation is carried out for each 5° C. using the temperature compensated oscillator shown in FIG. 18.

A temperature compensated oscillator according to a third embodiment of the invention and an adjusting method thereof will now be described. According to a third aspect of the invention, in the case in which the temperature step is determined based on the frequency deviation as in the second embodiment, the frequency deviation reference used for determination is changed at the peak temperature ($T_0$) of the frequency temperature characteristic of the resonator as shown in FIG. 16 such as a tuning fork type crystal resonator. In this manner, the total deviation for the entire temperature range is reduced.

The elements of the temperature compensated oscillator according to the embodiment are substantially the same as those according to the second embodiment, therefore the configuration is not particularly shown, and FIG. 9 for the second embodiment will be referred to in the following description. The temperature compensated oscillator according to the third embodiment is different from that according to the second embodiment mainly in how compensation data is set, and the method of adjusting the temperature compensated oscillator and the operation thereof will be described.

Figure 12:
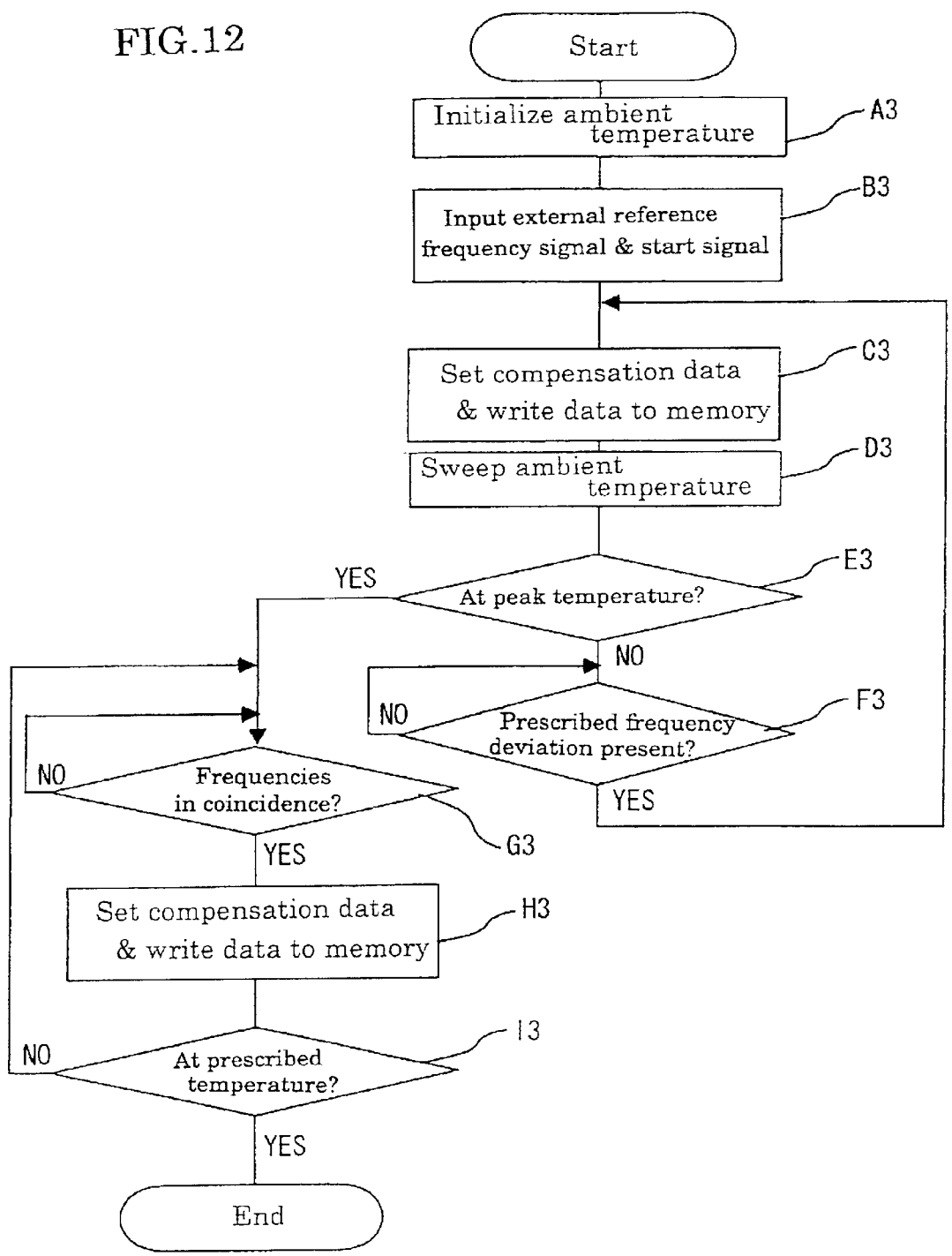
FIG. 12 is a flow chart for use in illustration of a compensation data setting processing in a method of adjusting a temperature compensated oscillator according to a third embodiment of the invention.

The flowchart in FIG. 12 will be referred to in the following description. In the temperature compensated oscillator in FIG. 9, as the capacitor array 4 is fixed in the state with the maximum capacitance value, control voltage VC is applied to a variable capacitance diode. In this state, the switch 8 is connected to the side of terminal A and the whole device of the oscillator is placed in a constant temperature chamber. The constant temperature chamber is set to a prescribed temperature of 95° C. and allowed to be stabilized at the temperature (step A3). Then, a start signal is applied to the timing control circuit 13 from outside the temperature compensated oscillator, and an external reference frequency signal is applied to a frequency comparison circuit 12 to start compensation data setting operation (step B3).

When the compensation data setting operation is started, the process the same as that from steps C1 to H1 according to the first embodiment is carried out to set compensation data, and the resultant compensation data is written in the memory 14 together with the digital signal output by the A/D converter 2 at the time, in other words with the temperature data (step C3).

Then, the compensation data setting operation for the next temperature step is carried out. The temperature set for the constant temperature chamber is swept to the low temperature side at a prescribed speed (step D3).

The timing control circuit 13 determines whether or not the peak temperature (25° C. for example) is exceeded based on the digital signal output by the A/D converter 2 (step E3). If the peak temperature is not reached, the timing control circuit 13 monitors the detection output of the frequency deviation from the frequency comparison circuit 12, and determines that the frequency deviation has reached a prescribed value of 10 ppm when it receives the detection output (step F3). Then, the compensation data setting operation for the next temperature step is started. More specifically, the compensation data is set by the operation from step C3, the data is written in the memory 14, the temperature set for the constant temperature chamber is swept, and compensation data for the next temperature step is set every time the frequency deviation reaches 10 ppm.

When the timing control circuit 13 determines that the peak temperature is exceeded in step E3, the circuit monitors in the frequency comparison circuit 12 as to whether or not the frequency deviation detected is enough to make an assumption that the frequency of the oscillation output signal of the oscillation circuit 5 and the reference frequency of the external reference frequency signal are matched. The detection of the match is regarded as a breakpoint between temperature steps (step G3). Therefore, according to the embodiment, the frequency comparison circuit 12 has a match detecting function for the purpose.

Now, when it is determined in step G3 that the frequency of the oscillation output signal and the reference frequency are matched, the successive comparison operation the same as that from steps C1 to H1 according to the first embodiment is carried out to set compensation data, while in this case the compensation data is set so that the frequency of the oscillation output signal has a deviation of +10 ppm from the external reference frequency rather than matching the frequencies of the oscillation output signal and the external reference frequency. The compensation data is written in the memory 14 together with temperature data at the time (step H3). If for example the oscillation frequency of the oscillation circuit 5 is lower than a frequency +10 ppm deviated from the external reference frequency signal, the frequency comparison circuit 12 outputs "1," and otherwise outputs "0." In this way, the successive comparison operation the same as that from steps C1 to H1 according to the first embodiment is carried out to set compensation data. Alternatively, the frequency comparison circuit 12 may shift the reference frequency signal by +10 ppm from the original frequency when the compensation data is set in step H3. Note however that in this case the timing for switching the reference frequency must be controlled for example by outputting a signal representing the setting timing for the compensation data from the timing control circuit 13 to the outside of the temperature compensated oscillator.

Based on the out put of the A/D converter 2, it is determined whether or not compensation data for each temperature step for a prescribed temperature range, for example from 95° C. to −45° C. is written in the memory 14 (step I3). Then, the compensation data setting operation for each temperature step is started. More specifically, as the setting temperature is swept the operation from step G3 is carried out, and the compensation data is determined so that an oscillation output signal having a deviation of +10 ppm from the reference frequency is obtained every time the frequency of the oscillation output signal and the reference frequency match. The data is then written in the memory 14. Thus, writing of compensation data for all the temperature steps in the prescribed temperature range is completed (step I3), and the compensation data setting operation according to the embodiment ends (END). The temperature compensated oscillator according to the embodiment has the compensation data thus set by the process and is completed.

Figure 13:
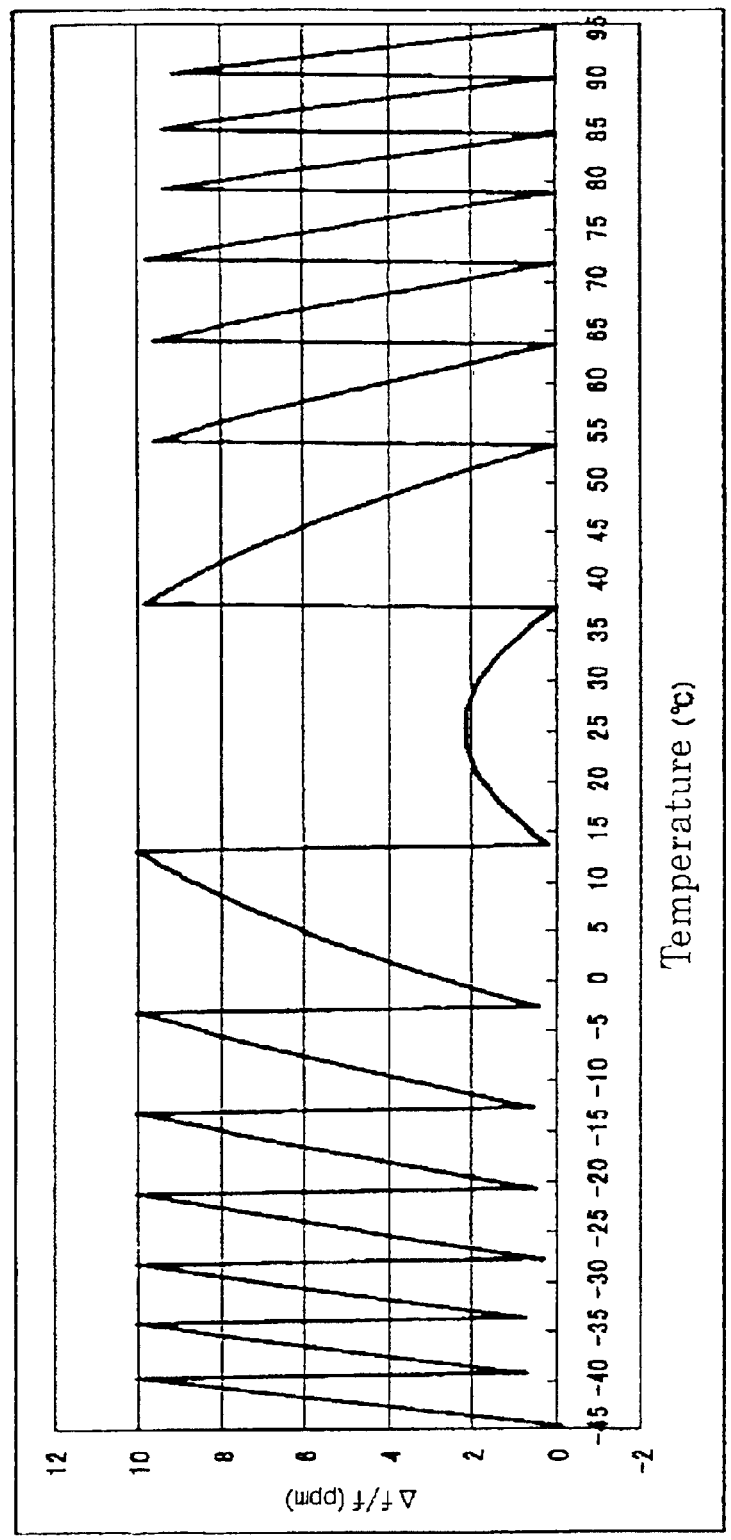
FIG. 13 is a chart showing a frequency-temperature characteristic after temperature compensation using compensation data by the temperature compensated oscillator according to the third embodiment.

According to the embodiment, the same function and effects as those according to the second embodiment are provided, while the following additional effect is provided. As shown in FIG. 11, according to the second embodiment, the frequency deviation takes a positive value on the higher temperature side than the peak temperature (about 25° C.), and a negative value on the lower temperature side. In the entire temperature range, the width of the frequency deviation is 20 ppm (±10 ppm). In contrast, according to the embodiment, the setting algorithm for the compensation data is changed at the peak temperature, so that the width of the frequency deviation is halved. More specifically, on the temperature side higher than the peak temperature, similarly to the second embodiment as shown in FIG. 11, compensation is carried out every time a prescribed frequency deviation (for example 10 ppm) from the reference frequency is generated. Meanwhile, on the lower temperature side, compensation to intentionally provide a frequency deviation of 10 ppm is carried out every time the frequency is substantially matched with the reference frequency. In this way, as shown in FIG. 13, the frequency deviation in the entire temperature range can be as small as the width of 10 ppm from 0 to 10 ppm. According to the embodiment, the tuning fork type crystal resonator is used as the resonator. Meanwhile, the same function and effects are provided using various other resonator whose frequency-temperature characteristic has the slope reversed in sign between before and after a peak temperature and by changing the adjusting algorithm at the peak temperature as described above. The invention is applicable to a resonator having more than one temperature peaks or an AT cut crystal resonator having a cubic frequency-temperature characteristic.

A fourth embodiment of the present invention will now be described. According to a fourth aspect of the invention, a frequency having a fixed deviation from a desired frequency is set as the external reference frequency and the average frequency deviation is reduced. As shown in FIG. 13, according to the third embodiment, the average frequency deviation in the entire temperature range is 10 ppm/2=5 ppm. The external reference frequency in the temperature compensation is set to a frequency having a prescribed deviation from a desired frequency, so that the average error in the entire frequency range can be almost zero. For example, according to the third embodiment, if an external reference frequency signal −5 ppm deviated from a desired frequency is used, the frequency-temperature characteristic is as shown in FIG. 14.

Figure 14:
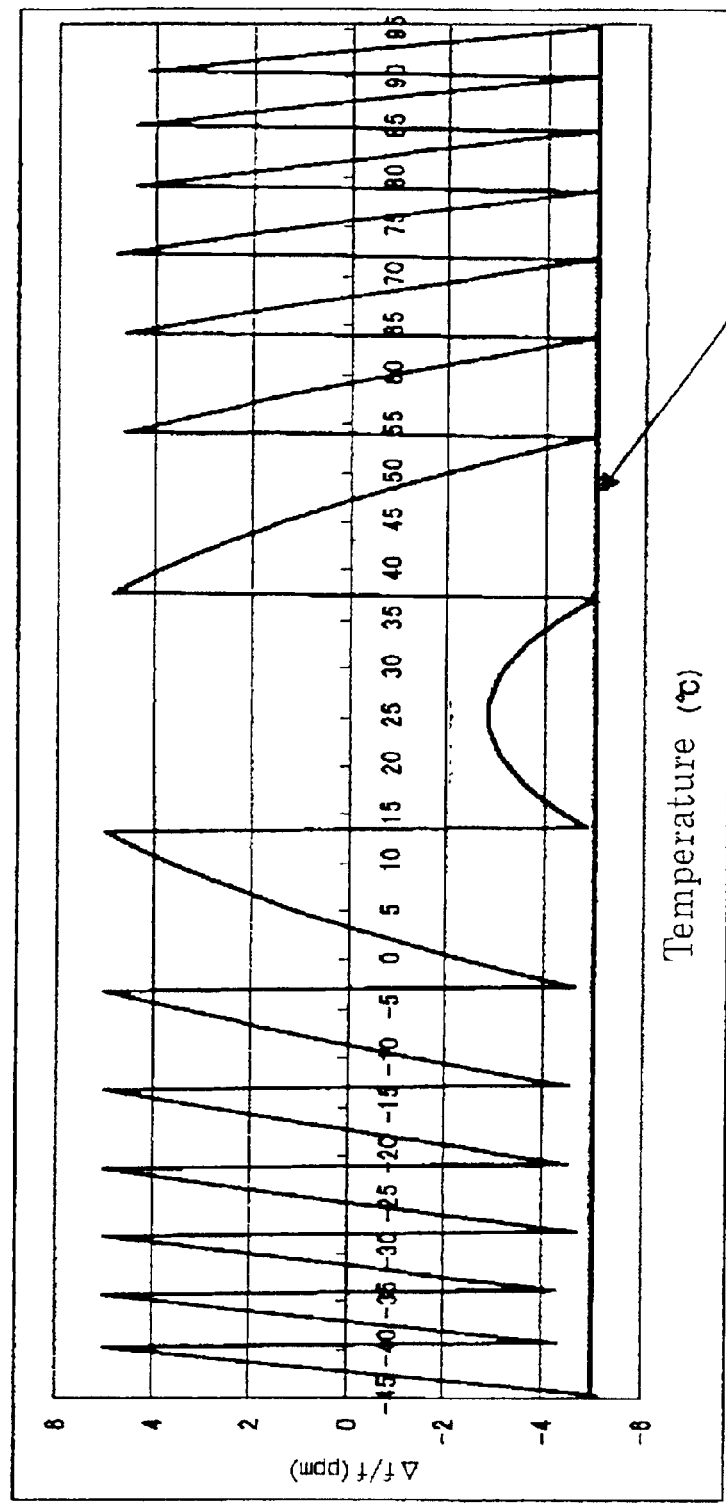
FIG. 14 is a chart showing a frequency-temperature characteristic after temperature compensation using compensation data by the temperature compensated oscillator according to a fourth embodiment of the invention.
Figure 15:
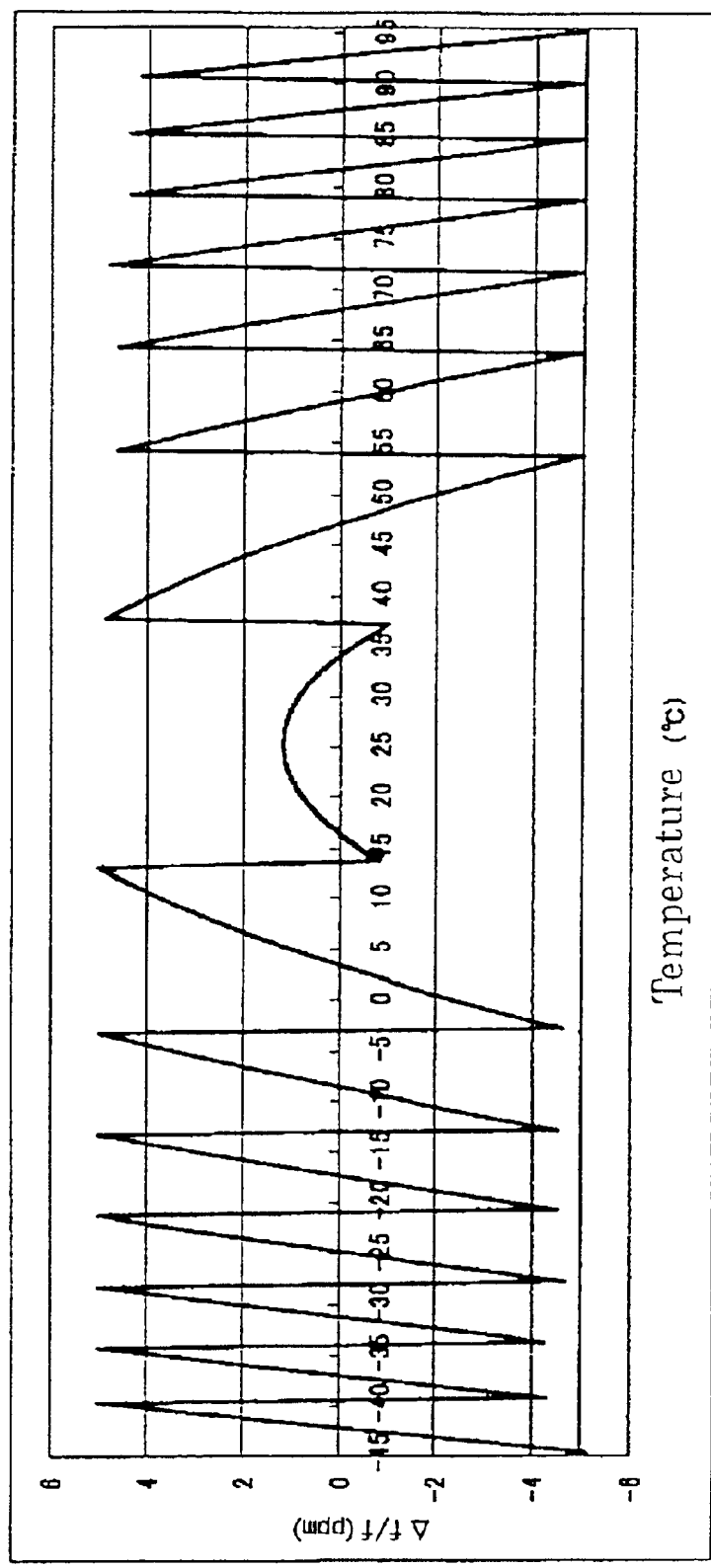
FIG. 15 is a chart showing a frequency-temperature characteristic after temperature compensation using another kind of compensation data by the temperature compensated oscillator according to the fourth embodiment.

As shown in FIG. 14, according to the embodiment, the error after the compensation in the vicinity of the peak temperature which is within the normal temperature range is large. This can be improved by providing the compensation frequency in the vicinity of the temperature with a fixed offset. As shown in FIG. 15, for example, in the range from 45° C. to 5° C. including the peak temperature, the use of an external reference frequency signal having a reference frequency not shifted from the desired frequency can achieve the offset.

Although not detailed, the same effects can be provided by making the frequency deviation in determining the temperature step for compensation different from the deviation of the frequency approximated in setting compensation data. As described above, according to the fourth embodiment, the same function and effects as those according to the third embodiment can be provided, while the average deviation in the entire temperature range can be almost zero.

According to the embodiment, a capacitor array and a voltage variable capacitive element are connected and used as a load capacitance for an oscillation circuit, the capacitance value of the former is digital-controlled, while the capacitance value of the latter is analog-controlled. In this way, the amount of compensation data necessary for the digital control is reduced and highly precise temperature compensation can be achieved.

After a temperature compensated oscillator is provided with an external resonator such as a crystal resonator, the ambient temperature of the temperature compensated oscillator is swept within a desired temperature range, and compensation data for temperature compensation for each temperature step is extracted and set by self-compensation operation. Therefore, a highly precise temperature compensated oscillator can be produced if the precision of the temperature detector, the A/D converter, the constant temperature chamber for temperature setting varies to some extent.

Furthermore, a point where a prescribed frequency difference is generated between the oscillation output signal and the external reference frequency signal is regarded as a breakpoint between temperature steps, and therefore the amount of compensation data can be reduced.

First and second processes are switched based on a particular temperature. In the first process a point where a prescribed frequency difference is generated between the oscillation output signal and the external reference frequency signal is regarded as a breakpoint between temperature steps and the frequency of the oscillation output signal is matched to that of the external reference frequency signal. In the second process a point where there is substantial coincidence between the frequency of the oscillation output signal and the frequency of the external reference frequency signal is regarded as a breakpoint between temperature steps, and the frequency of the oscillation output signal is matched to a frequency shifted from the external reference frequency by a prescribed frequency difference. Particularly, the peak temperature of the frequency-temperature characteristic of the resonator is regarded as a breakpoint to switch the first and second processes, and the width of the frequency deviation can be reduced. In this case, the frequency of the external reference frequency signal is set to a frequency shifted by the amount half of a prescribed frequency difference from a desired frequency, so that the average frequency deviation in the entire temperature range can be almost zero. Furthermore, in this case, in the vicinity of the peak temperature, the frequency of the external reference frequency signal is prevented from shifting to improve the frequency deviation in the vicinity of the peak temperature, and the average deviation in the entire temperature range can be almost zero. This can readily be applied to the temperature compensated oscillator using a tuning fork type crystal resonator having one peak temperature in the temperature compensation range, or to a resonator having a plurality of peak temperatures and still the above effects can be provided.

What is claimed is:

1. A temperature compensated oscillator, comprising:
   a temperature detector that outputs an analog signal depending on a temperature;
   an A/D converter for converting the analog signal from said temperature detector into a digital signal;
   a memory from which compensation data is read out using the digital signal from said A/D converter as an address;
   a capacitor array for selectively connecting a plurality of capacitive elements to an oscillation circuit based on said compensation data;
   said oscillation circuit causing a resonator such as a crystal resonator to oscillate thereby generating an oscillation output signal, and using said capacitor array as a frequency adjusting element for said oscillation output signal;
   a frequency comparison circuit for comparing frequencies of an external reference frequency signal and said oscillation output signal;
   a register in which a value of each bit is sequentially determined based on the frequency comparison result from said frequency comparison circuit;
   a switching circuit for selectively supplying the compensation data read out from the memory and a digital signal output from said register to said capacitor array;
   a voltage variable capacitive element connected to said capacitor array;
   a control voltage generation circuit for generating control voltage to control the capacitance of said voltage variable capacitive element in response to the analog signal from said temperature detector;
   said register supplying a digital signal output to said capacitor array through said switching circuit and said plurality of capacitive elements being connected to said oscillation circuit in response to said digital signal, so that said oscillation circuit carries out oscillation operation; and
   said register having the value of each bit sequentially determined based on the comparison result for each comparison operation by said frequency comparison circuit to change the frequency of said oscillation output signal, the digital signal output from said register when the frequency of said oscillation output signal of said oscillation circuit is matched with a particular frequency being written by a writing operation in said memory as said compensation data corresponding to a temperature that can be addressed using a digital signal output from said A/D converter corresponding to the temperature detected by said temperature detector at the time, so that the writing operation is carried out for each temperature step.

2. The temperature compensated oscillator according to claim 1, wherein a point where a prescribed frequency difference is generated between said oscillation output signal and said external reference frequency signal is regarded as a breakpoint between said temperature steps.

3. The temperature compensated oscillator according to claim 1, wherein:
   in a first process a point where a prescribed frequency difference is generated between said oscillation output signal and said external reference frequency signal is regarded as a breakpoint between said temperature steps and the frequency of said oscillation output signal is matched to the frequency of the external reference frequency signal, while in a second process a point where there is substantial coincidence between the frequency of the oscillation output signal and the frequency of the external reference frequency signal is regarded as a breakpoint between said temperature steps, and the frequency of the oscillation output signal is matched to a frequency shifted from the frequency of the external reference frequency signal by said prescribed frequency difference, and
   said first and second processes are switched at a particular temperature.

4. The temperature compensated oscillator according to claim 3, wherein the frequency of said external reference frequency signal is set to a frequency shifted from a desired frequency by half of said prescribed frequency difference.

5. The temperature compensated oscillator according to claim 4, wherein the frequency of said external reference frequency signal is prevented from being shifted in the vicinity of said particular temperature.

6. The temperature compensated oscillator according to any one of claims 3 to 5, wherein said particular temperature is a peak temperature in a frequency-temperature characteristic of said resonator.

7. A temperature compensated oscillator, comprising:
   a capacitor array having a plurality of selectively connected capacitive elements forming a variable capacitance;
   a voltage variable capacitive element connected to said capacitor array and forming a load capacitance with the capacitor array;
   a temperature detector that generates an output voltage depending on a temperature;
   a control voltage generation circuit for generating control voltage for temperature compensation to control said voltage variable capacitive element based on the output voltage of said temperature detector;
   a memory storing compensation data for each of a plurality of temperature steps;
   a control circuit responsive to the output voltage of said temperature detector for reading out said compensation data corresponding to said temperature from said memory and connecting a corresponding one of said capacitive elements of said capacitor array based on the compensation data; and
   a resonator assumed to have a frequency-temperature characteristic symmetric with respect to a peak temperature in a temperature range for temperature compensation, and said control voltage generation circuit generating said control voltage having a temperature characteristic symmetric with respect to said peak temperature.

8. A method of adjusting a temperature compensated oscillator, said temperature compensated oscillator comprising:
   a temperature detector that outputs an analog signal depending on a temperature;
   an A/D converter for converting the analog signal from said temperature detector into a digital signal;
   a memory from which compensation data is read out using the digital signal from said A/D converter as an address;

a capacitor array for selectively connecting a plurality of capacitive elements to an oscillation circuit based on said compensation data;

said oscillation circuit causing a resonator such as a crystal resonator to oscillate thereby generating an oscillation output signal, and using said capacitor array as a frequency adjusting element for said oscillation output signal;

a frequency comparison circuit for comparing frequencies of an external reference frequency signal and said oscillation output signal;

a register in which a value of each bit is sequentially determined based on the frequency comparison result from said frequency comparison circuit;

a switching circuit for selectively supplying the compensation data read out from the memory and a digital signal output from said register to said capacitor array;

said register supplying a digital signal output to said capacitor array through said switching circuit and said plurality of capacitive elements being connected to said oscillation circuit in response to said digital signal, so that said oscillation circuit carries out oscillation operation; and said register having the value of each bit sequentially determined based on the comparison result for each comparison operation by said frequency comparison circuit to change the frequency of said oscillation output signal, the digital signal output from said register when the frequency of the oscillation output signal from said oscillation circuit is matched with a particular frequency being written by a writing operating in said memory as said compensation data corresponding to a temperature that can be addressed using a digital signal output from said A/D converter corresponding to the temperature detected by said temperature detector at the time, so that the writing operation is carried out for each temperature step.

9. The method according to claim 8, wherein a point where a prescribed frequency difference is generated between said oscillation output signal and said external reference frequency signal is regarded as a breakpoint between said temperature steps.

10. The method according to claim 8, wherein in a first process a point where a prescribed frequency difference is generated between said oscillation output signal and said external reference frequency signal is regarded as a breakpoint between said temperature steps, and the frequency of the oscillation output signal is matched to the frequency of the external reference frequency signal, while in a second process a point where there is substantial coincidence between the frequency of said oscillation output signal and the frequency of the external reference frequency signal is regarded as a breakpoint between said temperature steps, and the frequency of the oscillation output signal is matched to a frequency shifted from the frequency of the external reference frequency signal by said prescribed frequency difference, and said first and second processes are switched at a particular temperature.

11. The method according to claim 10, wherein the frequency of said external reference frequency signal is set to a frequency shifted from a desired frequency by half of said prescribed frequency difference.

12. The method according to claim 11, wherein the frequency of said external reference frequency signal is prevented from being shifted in the vicinity of said particular temperature.

13. The method according to any one of claims 10 to 12, wherein said particular temperature is a peak temperature in a frequency-temperature characteristic of said resonator.

14. An integrated circuit for temperature compensated oscillator, comprising:

an A/D converter for converting an analog signal from a temperature detector into a digital signal;

a memory from which compensation data is read out using the digital signal from said A/D converter as an address;

a capacitor array for selectively connecting a plurality of capacitive elements to an oscillation circuit based on said compensation data;

said oscillation circuit connecting a resonator such as a crystal resonator thereby causing the resonator to generate an oscillation output signal, and using said capacitor array as a frequency adjusting element for said oscillation output signal;

a frequency comparison circuit for comparing frequencies of an external reference frequency signal and said oscillation output signal;

a register in which a value of each bit is sequentially determined based on the frequency comparison result from said frequency comparison circuit;

a switching circuit for selectively supplying the compensation data read out from said memory and a digital signal output from said register to said capacitor array;

a voltage variable capacitive element connected to said capacitor array;

a control voltage generation circuit for generating control voltage to control the capacitance of said voltage variable capacitive element in response to the analog signal from said temperature detector;

said register supplying a digital signal output to said capacitor array through said switching circuit and said plurality of capacitive elements being connected to said oscillation circuit in response to said digital signal, so that said oscillation circuit carries out oscillation operation; and said register having the value of each bit sequentially determined based on the comparison result for each comparison operation by said frequency comparison circuit to change the frequency of said oscillation output signal, the digital signal output from said register when the frequency of the oscillation output signal from said oscillation circuit is matched with a particular frequency being written by a writing operation in said memory as said compensation data corresponding to a temperature that can be addressed using a digital signal output from said A/D converter corresponding to the temperature detected by said temperature detector at the time, so that the writing operation is carried out for each temperature step.

15. The integrated circuit according to claim 14, wherein a point where a prescribed frequency difference is generated between said oscillation output signal and said external reference frequency signal is regarded as a breakpoint between said temperature steps.

16. The integrated circuit according to claim 14, wherein:

in a first process a point where a prescribed frequency difference is generated between said oscillation output signal and said external reference frequency signal is regarded as a breakpoint between said temperature steps, and the frequency of the oscillation output signal is matched to the frequency of the external reference frequency signal, while in a second process a point where there is substantial coincidence between the frequency of the oscillation output signal and the frequency of the external reference frequency signal is regarded as a breakpoint between said temperature steps, and the frequency of the oscillation output signal is matched to a frequency shifted from the frequency of the external reference frequency signal by a prescribed frequency difference, and said first and second processes are switched at a particular temperature.

17. The integrated circuit according to claim 16, wherein the frequency of said external reference frequency signal is set to a frequency shifted from a desired frequency by half of said prescribed frequency difference.

18. The integrated circuit according to claim 17, wherein the frequency of said external reference frequency signal is presented from being shifted in the vicinity of said particular temperature.

19. The integrated circuit according to any one of claims 16 to 18, wherein said particular temperature is a peak temperature in the frequency-temperature characteristic of said resonator.

20. An integrated circuit temperature compensated oscillator, comprising:

a capacitor array having a plurality of selectively connected capacitive elements forming a variable capacitance;

a temperature detector that generates an output voltage based on a temperature;

a voltage variable capacitive element connected to said capacitor array and forming a load capacitance with said capacitor array;

a control voltage generation circuit for generating control voltage for temperature compensation to control said voltage variable capacitive element based on the output voltage of said temperature detector;

a memory storing compensation data for each of a plurality of temperature steps;

a control circuit responsive to the output voltage of said temperature detector for reading out said compensation data corresponding to said temperature from said memory and connecting a corresponding one of said capacitive elements of said capacitor array based on the compensation data; and said control voltage generation circuit being connected with a resonator assumed to have a frequency-temperature characteristic symmetric with respect to a peak temperature in a temperature range for temperature compensation and generating said control voltage having a temperature characteristic symmetric with respect to said peak temperature.

* * * * *